(12) United States Patent
Choi et al.

(10) Patent No.: US 11,670,360 B2
(45) Date of Patent: *Jun. 6, 2023

(54) INTEGRATED CIRCUIT INCLUDING CELL ARRAY WITH WORD LINE ASSIST CELLS

(71) Applicant: Samsung Electronics Co., Ltd., Suwon-si (KR)

(72) Inventors: Taemin Choi, Seoul (KR); Seongook Jung, Seoul (KR); Keonhee Cho, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 28 days.

This patent is subject to a terminal disclaimer.

(21) Appl. No.: 17/335,606

(22) Filed: Jun. 1, 2021

(65) Prior Publication Data

US 2022/0139442 A1 May 5, 2022

(30) Foreign Application Priority Data

Oct. 30, 2020 (KR) .......................... 10-2020-0143879

(51) Int. Cl.
| | |
|---|---|
| *G11C 11/408* | (2006.01) |
| *G11C 11/4094* | (2006.01) |
| *G11C 11/4099* | (2006.01) |
| *G11C 11/4074* | (2006.01) |
| *G11C 5/06* | (2006.01) |

(52) U.S. Cl.
CPC .......... *G11C 11/4085* (2013.01); *G11C 5/06* (2013.01); *G11C 11/4074* (2013.01); *G11C 11/4094* (2013.01); *G11C 11/4099* (2013.01)

(58) Field of Classification Search
CPC ... G11C 11/4085; G11C 5/06; G11C 11/4074; G11C 11/4094; G11C 11/4099
See application file for complete search history.

(56) References Cited

U.S. PATENT DOCUMENTS

| | | | |
|---|---|---|---|
| 5,717,649 A | 2/1998 | Kim et al. | |
| 8,228,713 B2 | 7/2012 | Arsovski et al. | |
| 8,427,896 B1 | 4/2013 | Agarwal et al. | |
| 9,111,637 B1 | 8/2015 | Sahu et al. | |
| 9,721,647 B2 | 8/2017 | Ishii | |
| 10,431,272 B2 | 10/2019 | Baeck et al. | |
| 2012/0307574 A1* | 12/2012 | Cheng | G11C 11/419 365/189.14 |
| 2014/0286077 A1* | 9/2014 | Hatsuda | G11C 11/1659 365/148 |
| 2015/0380078 A1* | 12/2015 | Liaw | G11C 11/419 365/156 |

(Continued)

FOREIGN PATENT DOCUMENTS

| | | |
|---|---|---|
| KR | 19970051207 A | 7/1997 |
| KR | 100167296 B1 | 9/1998 |
| KR | 1020200045625 A | 5/2020 |

*Primary Examiner* — Tri M Hoang
(74) *Attorney, Agent, or Firm* — Myers Bigel, P.A.

(57) ABSTRACT

An integrated circuit includes: a cell array including a plurality of memory cells in a plurality of first columns and including a plurality of word line assist cells in at least one second column; a plurality of word lines respectively extending on a plurality of first rows of the cell array and connected to the plurality of memory cells and the plurality of word line assist cells; and a row driver configured to drive the plurality of word lines.

20 Claims, 19 Drawing Sheets

(56) References Cited

U.S. PATENT DOCUMENTS

| | | | |
|---|---|---|---|
| 2016/0086657 A1* | 3/2016 | Hong | G11C 11/417 |
| | | | 365/154 |
| 2017/0076785 A1 | 3/2017 | Ishii | |
| 2020/0294580 A1* | 9/2020 | Raj | G11C 11/419 |
| 2022/0148644 A1* | 5/2022 | Choi | G11C 7/12 |

* cited by examiner

INTEGRATED CIRCUIT INCLUDING CELL ARRAY WITH WORD LINE ASSIST CELLS

CROSS-REFERENCE TO RELATED APPLICATION

This application is based on and claims priority under 35 U.S.C. § 119 to Korean Patent Application No. 10-2020-0143879, filed on Oct. 30, 2020, in the Korean Intellectual Property Office, the disclosure of which is incorporated by reference herein in its entirety.

BACKGROUND

Embodiments of the inventive concept relate to an integrated circuit, and more particularly, to an integrated circuit including a cell array with word line assist cells.

Due to demand for high integration and developments in semiconductor fabrication processes, widths, intervals, and/or heights of wiring lines included in an integrated circuit may decrease, and parasitic elements in the wiring lines may increase. In addition, a power supply voltage of the integrated circuit may decrease for reduced power consumption, a high operation speed, and the like, and accordingly, the parasitic elements of the wiring lines may have more significant influences on the integrated circuit. Despite the parasitic elements, integrated circuit cell arrays with memory cells may be required to provide a stable, high performance operating environment according to the requirements of various applications.

SUMMARY

The inventive concept provides an integrated circuit configured to provide high or improved operation reliability despite parasitic elements and an operation method of the integrated circuit.

According to an aspect of the inventive concept, there is provided an integrated circuit including: a cell array including a plurality of memory cells in a plurality of first columns and a plurality of word line assist cells in at least one second column; a plurality of word lines respectively extending on a plurality of first rows of the cell array and connected to the plurality of memory cells and the plurality of word line assist cells; and a row driver configured to drive the plurality of word lines, wherein each of the plurality of word line assist cells is configured to accelerate activation of respective ones of the plurality of word lines, includes transistors identical to those of each of the plurality of memory cells, and has a footprint identical to that of each of the plurality of memory cells.

According to another aspect, there is provided an integrated circuit including: a cell array including a plurality of cells, the plurality of cells respectively comprising same transistors and respectively having a same footprint; a plurality of word lines respectively extending on a plurality of first rows of the cell array; and a row driver connected to the plurality of word lines, wherein the plurality of cells include a plurality of memory cells connected to the plurality of word lines and arranged in a series of first columns; a plurality of first word line assist cells connected to the plurality of word lines and arranged in a second column; a plurality of second word line assist cells connected to the plurality of word lines and arranged in a third column that is adjacent to the second column, wherein each of the plurality of first word line assist cells may have a first layout that is symmetrical to a second layout of a second word line assist cell, which is arranged in a same row as the plurality of first word line assist cells, with respect to an axis parallel to a column direction.

According to another aspect of the inventive concept, there is provided an integrated circuit including: a cell array including a plurality of cells, the plurality of cells respectively comprising same transistors and respectively having a same footprint; a plurality of word lines respectively extending on a plurality of first rows of the cell array; and a row driver connected to the plurality of word lines, wherein the plurality of cells include a plurality of first memory cells connected to the plurality of word lines and arranged in a series of first columns; a plurality of first word line assist cells arranged in at least one second column that is adjacent to the series of first columns; and a plurality of second memory cells connected to the plurality of word lines and arranged in a series of third columns that are adjacent to the at least one second column.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
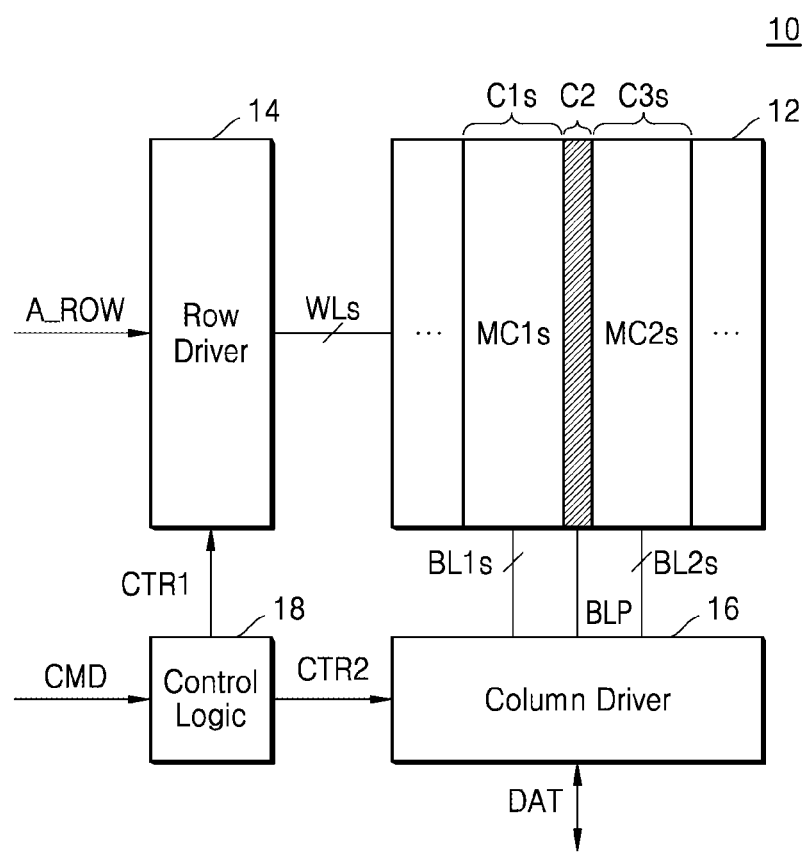
FIG. 1 is a block diagram of an integrated circuit according to an example embodiment of the inventive concept.

Hereinafter, embodiments will be described in detail with reference to the accompanying drawings. Like numeral references refer to like elements, and their repetitive descriptions are omitted. As used herein, the term "and/or" includes any and all combinations of one or more of the associated listed items. It is noted that aspects described with respect to one embodiment may be incorporated in different embodiments although not specifically described relative thereto. That is, all embodiments and/or features of any embodiments can be combined in any way and/or combination. FIG. 1 is a block diagram of an integrated circuit according to an example embodiment of the inventive concept. In detail, FIG. 1 is a block diagram of a memory device 10 included in an integrated circuit. In some embodiments, the integrated circuit may store data based on a command and an address provided from the outside of or external to the integrated circuit, and the memory device 10 may include a standalone memory device. Furthermore, in some embodiments, the integrated circuit may further include other components configured to write data to the memory device 10 or read data from the memory device 10, as will be described later with reference to FIG. 18, and the memory device 10 may include an embedded memory device. As shown in FIG. 1, the memory device 10 may include a cell array 12, a row driver 14, a column driver 16, and a control logic 18. Although not shown in FIG. 1, in some embodiments, the memory device 10 may further include an address buffer, a data buffer, a data input/output circuit, an internal voltage generator, and the like.

The memory device 10 may receive a command CMD, an address, and data. For example, the memory device 10 may receive a command CMD instructing a write operation (may be referred to as a write command), an address (may be referred to as a write address), and data (may be referred to as write data), and may store the received data in a region of the cell array 12 corresponding to the address. In addition, the memory device 10 may receive a command CMD instructing a read operation (may be referred to as a read command) and an address, and may output the data, which is stored in a region of the cell array 12 corresponding to the address, to an external recipient.

The cell array 12 may include a plurality of memory cells respectively accessed by word lines and bit lines. In some embodiments, the plurality of memory cells included in the cell array 12 may include volatile memory cells, such as static random access memory (SRAM), dynamic random access memory (DRAM), and the like. In some embodiments, the plurality of memory cells included in the cell array 12 may include non-volatile memory cells, such as flash memory, resistive random access memory (RRAM), and the like. Example embodiments will be described mainly with reference to an SRAM cell, as will be described below with reference to FIG. 3 and other figures. However, it is noted that example embodiments are not limited thereto.

Referring to FIG. 1, the cell array 12 may include a plurality of first memory cells MC1s in a series of first columns C1s, may include a plurality of word line assist cells in a second column C2, and may include a plurality of second memory cells MC2s in a series of third columns C3s. Each of the plurality of first memory cells MC1s may be connected to at least one of a plurality of first bit lines BL1s respectively extending on the series of first columns C1s, and may be connected to one of a plurality of word lines WLs respectively extending on a plurality of rows of the cell array 12. In addition, each of the plurality of second memory cells MC2s may be connected to at least one of a plurality of second bit lines BL2s respectively extending on the series of third columns C3s, and may be connected to one of the plurality of word lines WLs respectively extending on the plurality of rows of the cell array 12.

Each of the plurality of word line assist cells arranged in the second column C2 may be connected to a pseudo bit line BLP extending on the second column C2, and may be connected to one of the plurality of word lines WLs. A word line assist cell (or a word line assistance cell), which may also be referred to as a performance assist cell (or a performance assistance cell), may sense activation of a word line during a write operation or a read operation, and may accelerate and regenerate activation of the word line. Accordingly, effects attributed to parasitic elements of the plurality of word lines WLs may be compensated for, and the memory device 10 may have a generally high operation speed and generally high reliability. Examples of the word line assist cell will be described below with reference to FIG. 3 and other figures. In some embodiments, the word line assist cells may be arranged in two or more continuous columns, and a plurality of pseudo bit lines may respectively extend on the continuous columns.

As will be described below with reference to FIG. 2 and other figures, each of the plurality of word line assist cells may include the same or similar transistors and the same or similar footprints as those of the memory cell, that is, each of the plurality of first memory cells MC1s and the plurality of second memory cells MC2s. Accordingly, the plurality of word line assist cells may be formed by processes of forming the plurality of first memory cells MC1s and the plurality of second memory cells MC2s, and may not affect structures of the plurality of first memory cells MC1s and the plurality of second memory cells MC2s. Consequentially, due to a uniform structure of the word line assist cells, effects due to parasitic elements of the word lines extending in the cell array 12 with a high capacity may be efficiently removed, and a high yield of the integrated circuit including the memory device 10 may be achieved.

The row driver 14 may be connected to the cell array 12 through the plurality of word lines. The row driver 14 may activate one of the plurality of word lines WLs based on a row address A_ROW. Accordingly, among the plurality of first memory cells MC1s and the plurality of second memory cells MC2s, memory cells connected to the activated word line may be selected. Data DAT may be written to selected memory cells in the write operation, and the data DAT may be read from the selected memory cells in the read operation by way of the column driver 16 described below.

The column driver 16 may be connected to the cell array 12 through the plurality of first bit lines BL1s, the pseudo bit line BLP, and a plurality of second bit lines BL2s. In the read operation, the column driver 16 may identify values stored in memory cells connected to activated word lines, that is, the values stored in the selected memory cells, by sensing a current and/or voltage received through the plurality of first bit lines BL1s and the plurality of second bit lines BL2s, and may output data based on the identified values. Furthermore, in a write operation, the column driver 16 may apply a current and/or a voltage to the plurality of first bit lines BL1s and the plurality of second bit lines BL2s, and may write the values to the memory cells connected to the activated word line, that is, to the selected memory cells.

The column driver 16 may activate or deactivate the plurality of word line assist cells through the pseudo bit line BLP. For example, the column driver 16 may activate the plurality of word line assist cells arranged in the second column C2 by applying a negative supply voltage VSS to the pseudo bit line BLP, and may deactivate the plurality of word line assist cells arranged in the second column C2 by applying a positive supply voltage VDD to the pseudo bit line BLP. The activated word line assist cells may accelerate activation of the word lines connected thereto, while the deactivated word line assist cells may release acceleration of activation of the word lines. The column driver 16 may activate the plurality of word line assist cells before the word lines are activated, and may deactivate the plurality of word line assist cells before the word lines are deactivated. In some embodiments, as will be described below with reference to FIGS. 5 and 6, at least one power line connected to the plurality of word line assist cells may extend on the second column C2, and the column driver 16 may activate or deactivate the plurality of word line assist cells through the power line as well as the pseudo bit line BLP.

The control logic 18 may receive the command CMD and generate a first control signal CTR1 and a second signal CTR2. For example, the control logic 18 may identify the read command by decoding the command CMD, and may generate the first control signal CTR1 and the second control signal CTR2 to read the data DAT from the cell array 12. In addition, the control logic 18 may identify the write command by decoding the command CMD, and may generate the first control signal CTR1 and the second control signal CTR2 to write the data DAT to the cell array 12. In some embodiments, the row driver 14 may activate or deactivate a word line at a timing determined based on the first control signal CTR1. Furthermore, in some embodiments, at a timing determined based on a second control signal CTR2, the column driver 16 may sense a current and/or a voltage from the plurality of first bit lines BL1s and the plurality of second bit lines BL2s, or may apply the current and/or the voltage to the plurality of first bit lines BL1s, the pseudo bit line BLP, and the plurality of second bit lines BL2s.

Figure 2:
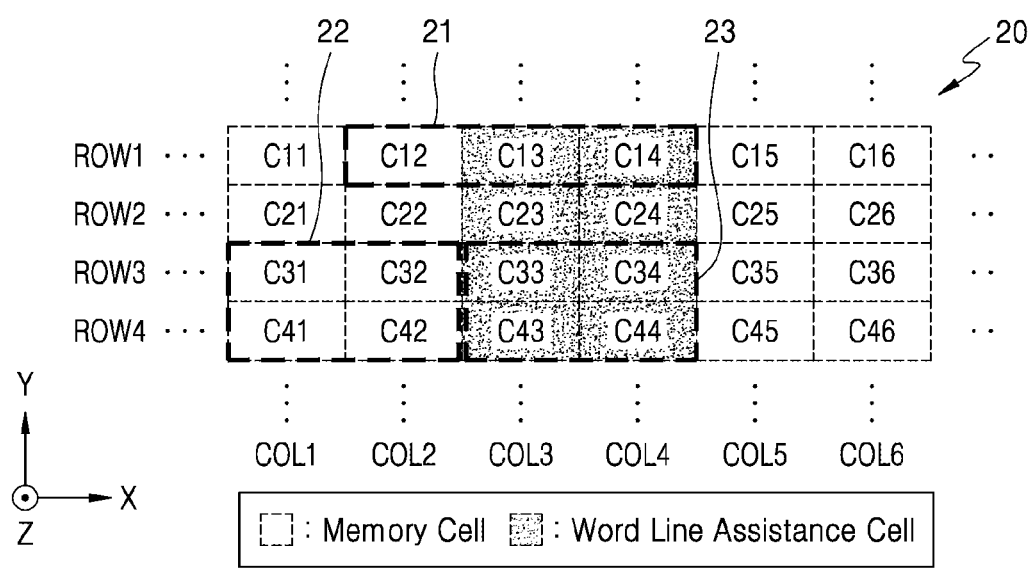
FIG. 2 is a top-plan view of a layout of a cell array according to an example embodiment of the inventive concept.

FIG. 2 is a top-plan view of a layout of a cell array 20 according to an example embodiment of the inventive concept. In detail, the top-plan view shown in FIG. 2 schematically illustrates a portion of the cell array 20 on a plane including the X axis and the Y axis. Herein, the plane including the X axis and the Y axis may be referred to as a horizontal plane, and the Z axis direction may be referred to as a vertical direction. In addition, a component arranged in the +Z direction relatively to another component may be referred to as being over or on the other component, and a component arranged in −Z direction relatively to another component may be referred to as being under the other component. In addition, an area of the component may refer to as a size of a portion occupied by the component on a plane that is parallel to a horizontal plane. In the drawings herein, for convenience of illustration, only some of layers may be shown. Furthermore, herein, a pattern including a conductive material, such as a pattern of a wiring layer may be referred to as a conductive pattern, or more simply, as a pattern, and components electrically connected to one another through the conductive pattern may be simply referred to as connected components.

Referring to FIG. 2, the cell array 20 may include a plurality of cells C11 through C46 respectively having a same footprint, and the plurality of cells C11 through C46 may include memory cells and word line assist cells. For example, as shown in FIG. 2, the cell array 20 may include cells C11, C12, C15, C16, and the like, which are memory cells, in a first column COL1, a second column COL2, a fifth column COL5, and a sixth column COL6. In addition, the cell array 20 may include cells C13, C14, and the like, which are the word line assist cells, in a third column COL3 and a fourth column COL4. Examples of a circuit corresponding to a region 21 including three cells C12, C13, and C14 will be described below with reference to FIG. 3 and FIG. 5.

In some embodiments, layouts of memory cells arranged in adjacent columns may be symmetrical with reference to an axis parallel to the Y axis. For example, the cell C11 arranged in the first row ROW1 and the first column COL1 may have a layout, which is obtained by flipping a layout of the cell C12 arranged in the first row ROW1 and the second column COL2 about an axis parallel to the Y axis. Accordingly, the cell array 20 may have repeated layouts in units of every two memory cells, and the word line assist cell may also be arranged in two adjacent columns, that is, the third column COL3 and the fourth column COL4, as shown in FIG. 2. An example of a layout of a region 22 including four cells C31, C32, C41, and C42, which are memory cells, will be described below with reference to FIG. 7, and an example of a layout of a region 23 including four cells C33, C34, C43, and C44, which are the word line assist cells, will be described below with reference to FIG. 8.

A plurality of word lines may extend in parallel to the X axis, and a plurality of bit lines and at least one pseudo bit line may extend parallel to the Y axis. For example, cells C21 through C26 arranged in the second row ROW2 may be connected to a word line extending parallel to the X axis on the second row ROW2. In addition, cells C15, C25, C35, and C45 arranged in the fifth column COL5 may be connected to at least one bit line extending parallel to the Y axis on the fifth column COL5, and cells C14, C24, C34, and C44 arranged in the four column COL4 may be connected to at least one pseudo bit line extending parallel to the Y axis on the fourth column COL4.

Figure 3:
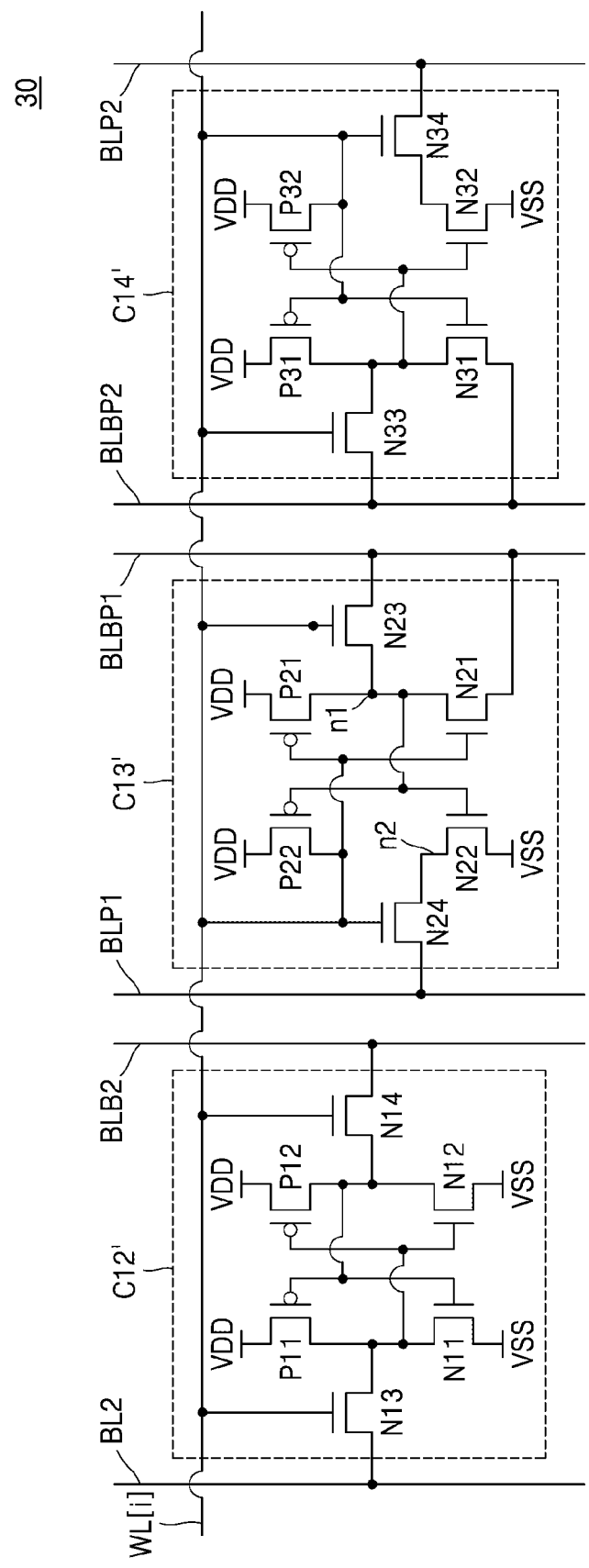
FIG. 3 is a circuit diagram of an example of a memory cell and a word line assist cell according to an example embodiment of the inventive concept.

FIG. 3 is a circuit diagram of an example of a memory cell and a word line assist cell according to an example embodiment of the inventive concept. In detail, the circuit diagram shown in FIG. 3 represents an equivalent circuit 30 corresponding to three cells C12, C13, and C14 included in the region 21 shown in FIG. 2. As described above with reference to FIG. 2, a memory cell C12', a first word line assist cell C13', and a second word line assist cell C14' shown in FIG. 3 may be arranged in a same row, that is, the first row ROW1 shown in FIG. 2. Hereinafter, FIG. 3 will be described with reference to FIG. 2.

The memory cell C12', the first word line assist cell C13', and the second word line assist cell C14' arranged in a same row may be connected in common to a word line WL[i] (i is an integer greater than 0). The memory cell C12' may be connected to the second bit line BL2 and a second complimentary bit line BLB2 extending on the second column COL2, the first word line assist cell C13' may be connected to a first pseudo bit line BLP1 and a second pseudo bit line BLBP1 extending on the third column COL3, and the second word line assist cell C14' may be connected to a third pseudo bit line BLBP2 and a fourth pseudo bit line BLP2 extending on the fourth column COL4. As will be described below with reference to FIG. 4, in some embodiments, the negative supply voltage VSS may be connected to the first pseudo bit line BLP1 and the fourth bit line BLP2. Furthermore, in some embodiments, the second pseudo bit line BLBP1 and the third pseudo bit line BLBP2 may be electrically connected to each other and have a same electric potential.

Referring to FIG. 3, the memory cell C12' may include a first p-channel field effect transistor (PFET) P11, a second PFET P12, and a first n-channel field effect transistor (NFET) N11 through a fourth NFET N14. The memory cell C12' may be a six transistors (6T)-SRAM cell, and may include an inverter pair cross-coupled between a node to which the positive supply voltage VDD is applied and a node to which the negative supply voltage (or a ground potential) VSS is applied. In the cross-coupled inverter pair, a first inverter may include the first PFET P11 and the first NFET N11, and a second inverter may include the second PFET P12 and the second NFET N12. In addition, the third NFET N13 and the fourth NFET N14 may be referred to as pass transistors configured to connect the first inverter and the second inverter respectively to the second bit line BL2 and the second complimentary bit line BLB2 by the word line WL[i] that is activated (that is, having a high level voltage).

The first word line assist cell C13' and the second word line assist cell C14' may respectively include transistors similar to or identical to that of the memory cell C12'. For example, as shown in FIG. 3, the first word line assist cell C13' may include a first PFET P21, a second PFET P22, and a first NFET N21 through a fourth NFET N24 respectively corresponding to the first PFET P11, the second PFET P12, and the first NFET N11 through the fourth NFET N14 of the memory cell C12'. In addition, the second word line assist cell C14' may include a first PFET P31, a second PFET P32, and a first NFET N31 through a fourth NFET N34 respectively corresponding to the first PFET 21, the second PFET P22, and the first NFET N21 through the fourth NFET N24 of the memory cell C12'. Accordingly, as will be described later with reference to FIGS. 7 and 8, the first word line assist cell C13' and the second word line assist cell C14' may include active regions and gate electrodes corresponding to a layout of the memory cell C12'.

Herein, the transistors may have arbitrary structures. For example, the transistors may include a fin field effect transistor (FinFET) formed by an active pattern extending in a fin shape and a gate electrode. The transistors may also include a multi-bridge channel FET (MBCFET) formed by a plurality of nanosheets extending in parallel to each other and a gate electrode. The transistors may also include a ForkFET having a structure in which nanosheets for PFET and nanosheets for NFET are separated by a dielectric wall and the NFET and the PFET are closer to each other. The transistors may also include a vertical FET (VFET) including source/drain regions, which are apart from each other in the Z direction, and a gate electrode bordering or surrounding a channel region, in FIG. 2. The transistors may include field effect transistors (FET), such as a complimentary FET (CFET), a negative CFET (NCFET), and a carbon nanotube FET (CNTFET), and may include a bipolar junction transistor or other three-dimensional transistors.

Referring to FIG. 3, in the first word line assist cell C13', the first PFET P21 may be connected to a node, to which the positive supply voltage VDD is applied, and a first node n1, and may include a control terminal (for example, a gate) connected to the word line WL[i]. The first NFET N21 may be connected between the first node n1 and the second pseudo bit line BLBP1, and may include a control terminal connected to the word line WL[i]. The second PFET P22 may be connected between the node, to which the positive supply voltage VDD is applied, and a second node n2, and may include a control terminal connected to the first node n1. The second NFET N22 may be connected between the second node n2 and a node to which the negative supply voltage VSS is applied (which may be referred to as a second power node), and may include a control terminal connected to the first node n1. The third NFET N23 may be connected between the first node n1 and the second pseudo bit line BLBP1, and may include a control terminal connected to the word line WL[i]. The fourth NFET N24 may be connected between the second node n2 and the first pseudo bit line BLP1, and may include a control terminal connected to the word line WL[i]. In the second word line assist cell C14', the first PFET P31 and the second PFET P32, and the first NEFT N31 through the fourth NFET N34 may be connected in a structure similar to that of the first word line assist cell C13'. Examples of operations of the first word line assist cell C13' and the second word line assist cell C14' will be described below with reference to FIG. 4.

Figure 4:
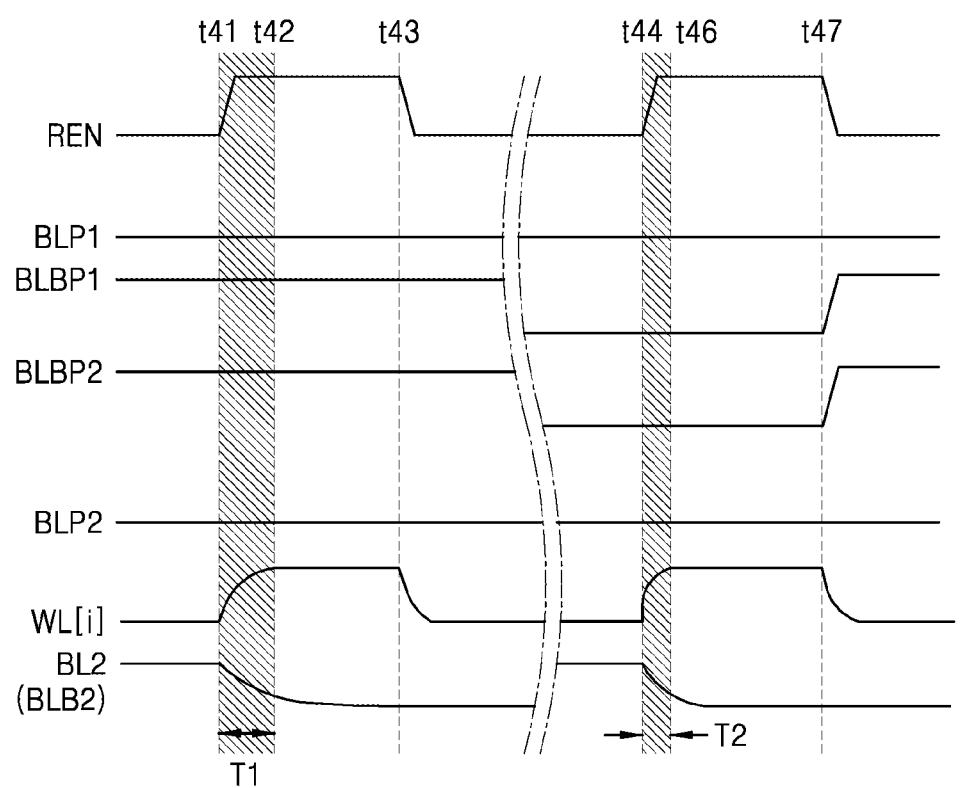
FIG. 4 is a timing chart illustrating a read operation according to an example embodiment of the inventive concept.

FIG. 4 is a timing diagram of a read operation according to an example embodiment of the inventive concept. In detail, the timing diagram shown in FIG. 4 illustrates signals of the equivalent circuit 30 in FIG. 3 over time in an example in which a word line assist cell is not used in the read operation and in an example in which the word line assist cell is used in the read operation. Herein, it is assumed that the signals are active-high signals that have a high level when activated, but it will be understood that example embodiments are not limited thereto. In addition, although the read operation is shown in FIG. 4 as an example of an operation to compensate for the effects due to the parasitic element of the word line, it will be understood that the effects due to the parasitic element of the word line may also be compensated for in the write operation, similar to that shown in FIG. 4. Hereinafter, FIG. 4 will be described with reference to FIGS. 1 and 3, and among descriptions of FIG. 4, repeated descriptions will be omitted.

Referring to FIG. 4, a read enable signal REN may be activated at a time point t41. For example, the first control signal CTR1 and the second control signal CTR2 in FIG. 1 may include the read enable signal REN, and the control logic 18 may activate the read enable signal REN based on the read command. The row driver 14 may activate the word line WL[i] corresponding to the row address A_ROW, in response to the read enable signal REN that has been activated. Accordingly, a voltage of the word line WL[i] may gradually increase as shown in FIG. 4. According to a value stored in the memory cell C12' due to the activated word line WL[i], a voltage of the second bit line BL2 (or the second complimentary bit line BLB2) may gradually decrease.

The negative supply voltage VSS may be applied to the first pseudo bit line BLP1 and the fourth pseudo bit line BLP2, and the positive supply voltage VDD may be applied to the second pseudo bit line BLBP1 and the third pseudo bit line BLBP2. Referring to FIG. 3, due to the word line WL[i] that has been activated, a voltage of the first node n1 in the first word line assist cell C13' may rise approximately up to the positive supply voltage VDD, and as the second PFET P22 is turned off, the first word line assist cell C13' may not affect the voltage of the word line WL[i]. That is, the first word line assist cell C13' and the second word line assist cell C14', which are deactivated due to the second pseudo bit line BLBP1 and the third pseudo bit line BLBP2 to which the positive supply voltage VDD is applied, may not affect the activation of the word line WL[i]. Accordingly, as shown in FIG. 4, the voltage of the word line WL[i] may approximately reach the positive supply voltage VDD at a time point t42 due to a parasitic element of the word line WL[i], and a first period T1 from the time point t41 to a time point t42 may be longer than a second period T2 to be described below. In addition, due to the first period T1 that is relatively extended, a voltage of the second bit line BL2 may drop slowly.

The read enable signal REN may be deactivated at a time point t43. The row driver 14 may deactivate the word line WL[i] in response to the read enable signal REN that has been deactivated, and the voltage of the word line WL[i] may decrease as shown in FIG. 4. The column driver 16 may identify a value stored in the memory cell C12' based on voltages and/or currents of the second bit line BL2 and the second complimentary bit line BLB2. The voltage of the second bit line BL2, which slowly dropped due to the parasitic element of the word line WL[i], may cause an error when the column driver 16 identifies a value, and may also decrease a read rate by delaying a time point at which the column driver 16 identifies the value.

The read enable signal REN may be activated at a time point t44. The row driver 14 may activate the word line WL[i], corresponding to the row address A_ROW, in response to the read enable signal REN that has been activated. Accordingly, as shown in FIG. 4, the voltage of the word line WL[i] may gradually increase, and a voltage of the second bit line BL2 (or the second complimentary bit line BLB2) may gradually decrease.

The negative supply voltage VSS may be applied to the first pseudo bit line BLP1, the second pseudo bit line BLBP1, the third pseudo bit line BLBP2, and the fourth pseudo bit line BLP2. Referring to FIG. 3, due to the word line WL[i] that has been activated and the second pseudo bit line BLBP1 to which the negative supply voltage VSS is applied, a voltage of the first node n1 in the first word line assist cell C13' may drop approximately to the negative supply voltage VSS, and as the second PFET P22 is turned on, the positive supply voltage VDD may be provided to the second node n2. That is, due to the second pseudo bit line BLBP1 and the third pseudo bit line BLBP2 to which the negative supply voltage VSS is applied, the first word line assist cell C13' and the second word line assist cell C14' may be activated, may sense the activation of the word line WL[i], and may accelerate and regenerate the activation of the word line WL[i]. Accordingly, as shown in FIG. 4, the voltage of the word line WL[i] may approximately reach the positive supply voltage VDD at a time point t46 despite the parasitic element of the word line WL[i], and the second period T2 from the time point t44 to the time point t46 may be shorter than the first period T1 described above. In addition, due to the second period T2 that is relatively shorter, the voltage of the second bit line BL2 may drop at an early stage.

The read enable signal REN may be deactivated at a time point t47. The row driver 14 may deactivate the word line WL[i] in response to the read enable signal REN that has been deactivated, and the voltage of the word line WL[i] may decrease as shown in FIG. 4. The column driver 16 may apply the positive supply voltage VDD to the second pseudo bit line BLBP1 and the third pseudo bit line BLBP2, and accordingly, the first word line assist cell C13' and the second word line assist cell C14' may be deactivated. The column driver 16 may identify the value stored in the memory cell C12' based on the voltages and/or currents of the second bit line BL2 and the second complimentary bit line BLB2. The voltage of the second bit line BL2, which dropped at an early stage despite the parasitic element of the word line WL[i], may allow the column driver 16 to safely identify the value, and may increase the read speed by allowing the column driver 16 to identify the value at the early stage. In some embodiments, the positive supply voltage VDD may be applied to the second pseudo bit line BLBP1 and the third pseudo bit line BLBP2 before the read enable signal REN is deactivated (or before the word line WL[i] is deactivated), and accordingly, the first word line assist cell C13' and the second word line assist cell C14' may be deactivated in advance before the word line WL[i] is deactivated.

Figure 5:
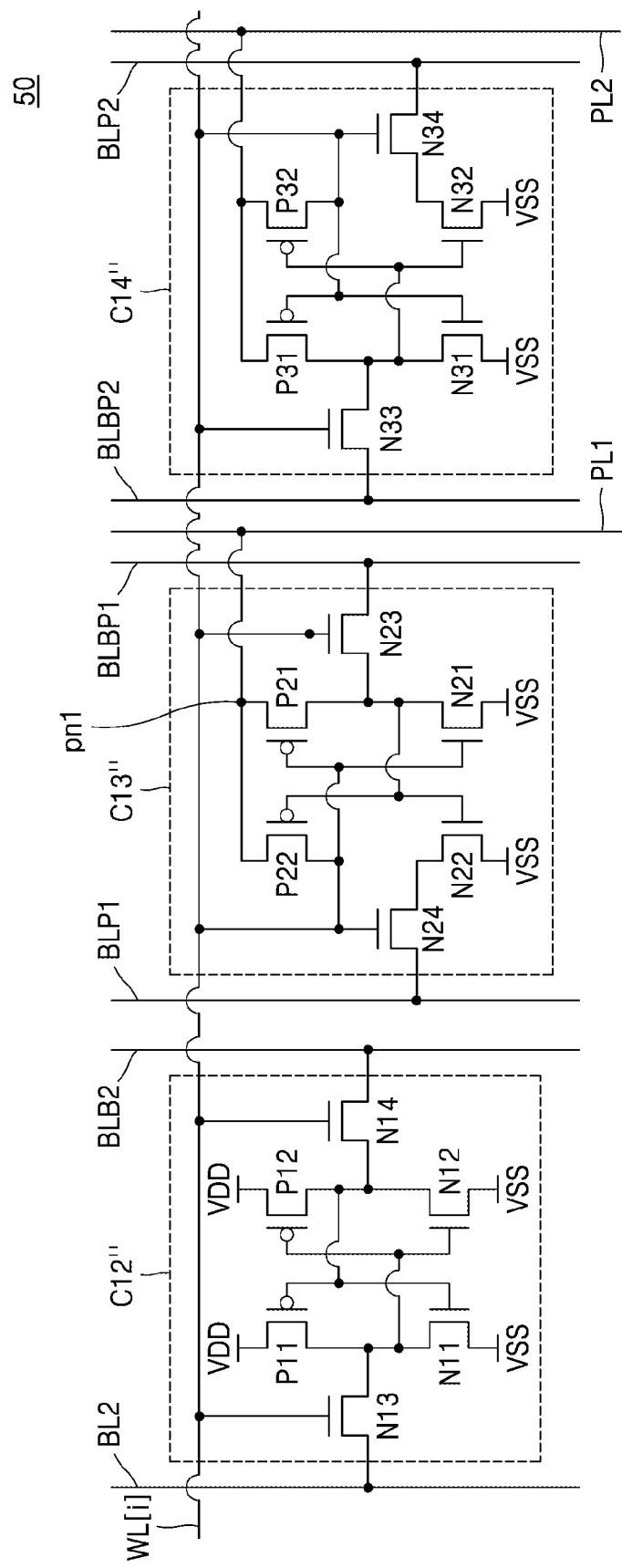
FIG. 5 is a circuit diagram of an example of a memory cell and a word line assist cell according to an example embodiment of the inventive concept.

FIG. 5 is a circuit diagram of an example of a memory cell and a word line assist cell according to an example embodiment of the inventive concept. In detail, the circuit diagram shown in FIG. 5 represents an equivalent circuit 50 corresponding to the three cells C12, C13, and C14 included in the region 21 shown in FIG. 2. As described above with reference to FIG. 2, a memory cell C12", a first word line assist cell C13", and a second word line assist cell C14" may be arranged in a same row, that is, the first row ROW1 shown in FIG. 2. Compared to the equivalent circuit 30 in FIG. 3, in the equivalent circuit 50 of FIG. 5, the first word line assist cell C13" and the second word line assist cell C14" may be connected to the first power line PL1 and the second power line PL2, respectively. Hereinafter, FIG. 5 will be described with reference to FIG. 2, and among descriptions of FIG. 5, descriptions that are the same as descriptions of FIG. 3 will be omitted.

Referring to FIG. 5, the memory cell C12" may be connected to the word line WL[i], the second bit line BL2, and the second complimentary bit line BLB2, and may include the first PFET P11, the second PFET P12, and the first NFET N11 through the fourth NFET N14. The first word line assist cell C13" may be connected to the word line WL[i], the first pseudo bit line BLP1, and the second pseudo bit line BLBP1, and may include the first PFET P21, the second PFET P22, and the first NFET N21 through the fourth NFET N24. The second word line assist cell C14" may be connected to the word line WL[i], the third pseudo bit line BLBP2, and the fourth pseudo bit line BLB2, and may include the first PFET P31, the second PFET P32, and the first NFET N31 through the fourth NFET N34.

The first word line assist cell C13" may be connected to the first power line PL1 extending on the third column COL3, and may receive the positive supply voltage VDD through the first power line PL1. In addition, the second word line assist cell C14" may be connected to the second power line PL2 extending on the fourth column COL4, and may receive the positive supply voltage VDD through the second power line PL2. The first power line PL1 and the second power line PL2 may be connected to a column driver (e.g., the column driver 16 in FIG. 1), and the column driver may activate or deactivate the first word line assist cell C13" and the second word line assist cell C14" through the first power line PL1 and the second power line PL2, as well as through the second pseudo bit line BLBP1 and the third pseudo bit line BLBP2. For example, in the first word line assist cell C13", a voltage of a first power node pn1 to which the first PFET P21 and the second PFET P22 are connected may vary according to control of the column driver. Examples of operations of the first word line assist cell C13" and the second word line assist cell C14" will be described below with reference to FIG. 6.

Figure 6:
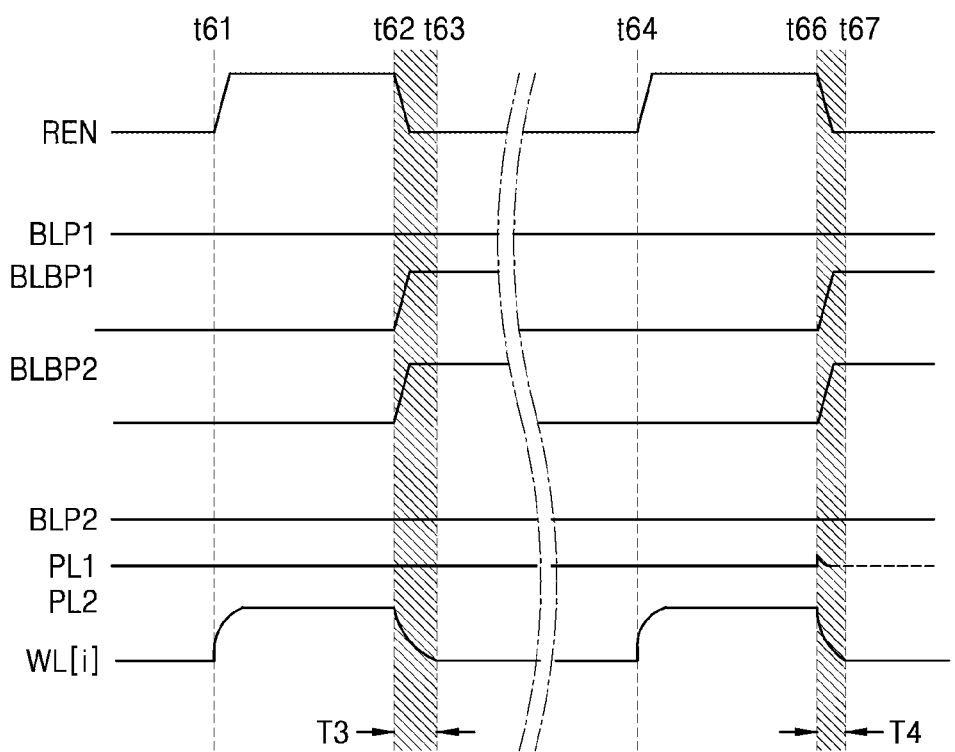
FIG. 6 is a timing chart illustrating a read operation according to an example embodiment of the inventive concept.

FIG. 6 is a timing diagram of a read operation according to an example embodiment. In detail, the timing diagram shown in FIG. 6 illustrates signals of the equivalent circuit 50 in FIG. 5 over time, in an example in which the power line is not controlled in the read operation and in an example in which the power line is controlled in the read operation. Hereinafter, FIG. 6 will be described with reference to FIGS. 1 and 5, and among descriptions of FIG. 6, descriptions that are the same as those of FIG. 4 will be omitted.

Referring to FIG. 6, the read enable signal REN may be activated at a time point t61. The row driver 14 in FIG. 1 may activate the word line WL[i], corresponding to the row address A_ROW, in response to the activated read enable signal REN. The negative supply voltage VSS may be applied to the second pseudo bit line BLBP1 and the third pseudo bit line BLBP2, and the positive supply voltage VDD may be applied to the first power line PL1 and the second power line PL2. Accordingly, the first word line assist cell C13" and the second word line assist cell C14" may be activated, and the activation of the word line WL[i] may be accelerated.

At a time point t62, the read enable signal REN may be deactivated. The row driver 14 may deactivate the word line WL[i] in response to the read enable signal REN that has been deactivated, and the voltage of the word line WL[i] may decrease as shown in FIG. 6. The column driver 16 may apply the positive supply voltage VDD to the second pseudo bit line BLBP1 and the third pseudo bit line BLBP2, and accordingly, the first word line assist cell C13" and the second word line assist cell C14" may be deactivated. The column driver 16 may maintain the positive supply voltage VDD applied to the first power line PL1 and the second power line PL2, the voltage of the word line WL[i] may approximately reach the negative supply voltage VSS at a time point t63, and a third period T3 from the time point t62 to the time point t63 may be longer than a fourth period T4 to be described below.

At a time point t64, the read enable signal REN may be activated. The row driver 14 may activate the word line WL[i], corresponding to the row address A_ROW, in response to the read enable signal REN that has been activated. The negative supply voltage VSS may be applied to the second pseudo bit line BLBP1 and the third pseudo bit line BLBP2, and the positive supply voltage VDD may be applied to the first power line PL1 and the second power line PL2. Accordingly, the first word line assist cell C13" and the second word line assist cell C14" may be activated, and the activation of the word line WL[i] may be accelerated.

At a time point t66, the read enable signal REN may be deactivated. The row driver 14 may deactivate the word line WL[i] in response to the read enable signal REN that has been deactivated, and the voltage of the word line WL[i] may decrease as shown in FIG. 6. The column driver 16 may apply the positive supply voltage VDD to the second pseudo bit line BLBP1 and the third pseudo bit line BLBP2, and accordingly, the first word line assist cell C13" and the second word line assist cell C14" may be deactivated. In addition, the column driver 16 may block the positive supply voltage VDD applied to the first power line PL1 and the second power line PL2, and accordingly, as shown with dotted lines of FIG. 6, the first power line PL1 and the second power line PL2 (or the first power node pn1) may be floated. Accordingly, the voltage of the word line WL[i] may drop at an early stage, and deactivation of the word line WL[i] may be accelerated. The voltage of the word line WL[i] may approximately reach the negative supply voltage VSS at a time point t67, and the fourth period T4 from the time point t66 to the time point t67 may be shorter than the third period T3 described above.

Figure 7:
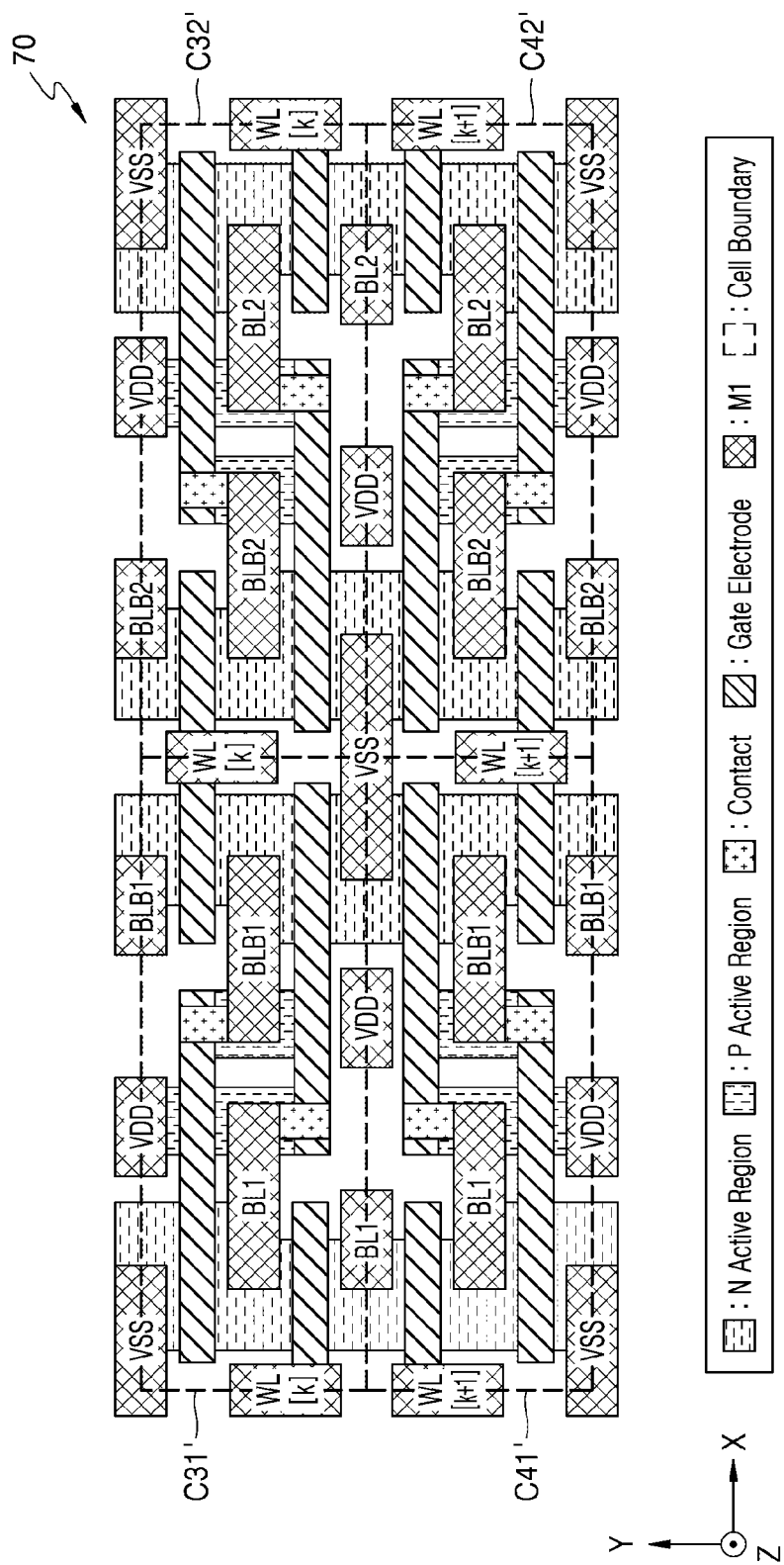
FIG. 7 is a top-plan view of a layout of a cell array according to an example embodiment of the inventive concept.

FIG. 7 is a top-plan view of a layout of a cell array 70 according to an example embodiment of the inventive concept. In detail, the top-plan view shown in FIG. 7 illustrates a layout corresponding to the four cells C31, C32, C41, and C42 included in the region 22 shown in FIG. 2. In FIG. 7, a name written on a pattern indicates a line to which the pattern is electrically connected or a voltage that is applied to the pattern.

As shown in FIG. 7, a first memory cell C31' and a second memory cell C32' may be arranged in a same row (that is, the third row ROW3 in FIG. 2), and may be connected in common to a word line WL[k] (where k is an integer greater than 0). A third memory cell C41' and a fourth memory cell C42' may be arranged in a same row (that is, the fourth row ROW4 in FIG. 2), and may be connected in common to a word line WL[k+1]. In addition, the first memory cell C31' and the third memory cell C41' may be connected in a same column (that is, the first column COL1 in FIG. 2), and may be connected in common to the first bit line BL1 and the first complimentary bit line BLB1. The second memory cell C32' and the fourth memory cell C42' may be arranged in a same column (that is, the second column COL2 in FIG. 2), and may be connected in common to the second bit line BL2 and the second complimentary bit line BLB2.

In some embodiments, memory cells included in the cell array 70 may have symmetrical layouts. For example, a first layout of the first memory cell C31' may be identical to a layout that is obtained by flipping a second layout of the second memory cell C32' about an axis parallel to the column direction, that is, an axis parallel to the Y axis. In addition, a third layout of the third memory cell C41' may be identical to a layout that is obtained by flipping the first layout of the first memory cell C31' about an axis parallel to the row direction, that is, an axis parallel to the X axis. In addition, a fourth layout of the fourth memory cell C42' may be identical to a layout, which is obtained by flipping the third layout of the third memory cell C41' about the axis parallel to the column direction, and a layout which is obtained by flipping the second layout of the second memory cell C32' about the axis parallel to the row direction. In some embodiments, the first memory cell C31' and the fourth memory cell C42' may have a same or similar layout, and the second memory cell C32' and the third memory cell C41' may have a same or similar layout. As will be described below with reference to FIG. 8, a word line assist cell may include active regions and gate electrodes identical to the layout of the memory cell.

Figure 8:
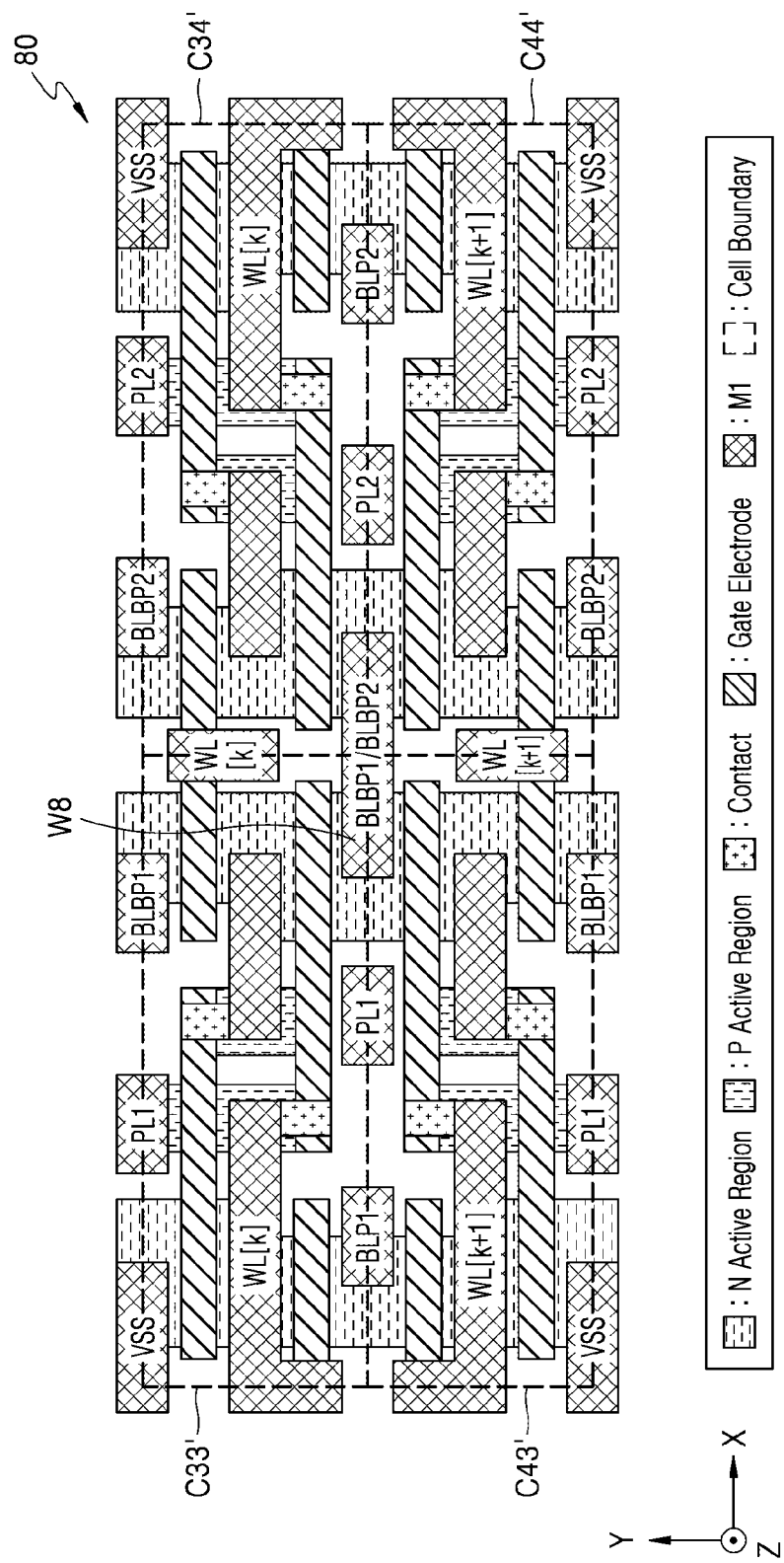
FIG. 8 is a top-plan view of a layout of a cell array according to an example embodiment of the inventive concept.

FIG. 8 is a top-plan view of a layout of a cell array 80 according to an example embodiment of the inventive concept. In detail, the top-plan view shown in FIG. 8 illustrates a layout corresponding to the four cells C33, C34, C43, and C44 included in the region 23 in FIG. 2. In FIG. 8, a name on a pattern indicates a line to which the pattern is electrically connected and/or a voltage that is applied to the pattern.

As shown in FIG. 8, a first word line assist cell C33' and a second word line assist cell C34' may be arranged in a same row (that is, the third row ROW3 in FIG. 2), and may be connected in common to the word line WL[k]. A third word line assist cell C43' and a fourth word line assist cell C44' may be arranged in a same row (that is, the fourth row ROW4 in FIG. 4), and may be connected in common to the word line WL[k+1]. In addition, the first word line assist cell C33' and the third word line assist cell C43' may be arranged in a same column (that is, the third column COL3 in FIG. 2), and may be connected in common to the first pseudo bit line BLP1 and the second pseudo bit line BLBP1. The second word line assist cell C34' and the fourth word line assist cell C44' may be arranged in a same column (that is, the fourth column COL4 in FIG. 2), and may be connected in common to the third pseudo bit line BLBP2 and the fourth pseudo bit line BLP2.

In some embodiments, the second pseudo bit line BLBP1 and the third pseudo bit line BLBP2 for controlling activation of the first word line assist cell C33', the second word line assist cell C34, the third word line assist cell C43, and the fourth word line assist cell C44' may have a same electrical potential, and as shown in FIG. 8, the first word line assist cell C33', the second word line assist cell C34', the third word line assist cell C43', and the fourth word line assist cell C44' may share a pattern W8 connected to the second pseudo bit line BLBP1 and the third pseudo bit line BLBP2. In some embodiments, as described above with reference to FIG. 3, the positive supply voltage VDD may also be applied to the first power line PL1 and the second power line PL2. In addition, in some embodiments, as described above with reference to FIG. 5, the first power line PL1 and the second power line PL2 may be connected to a column driver (for example, the column driver 16 in FIG. 1), and the positive supply voltage VDD may be applied to the first power line PL1 and the second power line PL2 or the first power line PL1 and the second power line PL2 may be floated, according to control of the column driver.

In some embodiments, the word line assist cells included in the cell array 80 may have layouts that are symmetrical to each other. For example, a layout of the first word line assist cell C33' may be identical to a layout that is obtained by flipping a layout of the second word line assist cell C34' about the axis parallel to the column direction. In addition, a layout of the third word line assist cell C43' may be identical to a layout that is obtained by flipping the layout of the first word line assist cell C33' about the axis parallel to the row direction. In addition, a layout of the fourth word line assist cell C44' may be identical to a layout, which is obtained by flipping the layout of the third word line assist cell C43' about the axis parallel to the column direction, and a layout that is obtained by flipping the layout of the second word line assist cell C34' about the axis parallel to the row direction. In some embodiments, the first word line assist cell C33' and the fourth word line assist cell C44' may have a same or similar layout, and the second word line assist cell C43' and the third word line assist cell C43' may have a same or similar layout.

A word line assist cell may include active regions and gate electrodes identical or similar to the layout of the memory cell. For example, the first word line assist cell C33' may include active regions and gate electrodes identical to active regions extending in the Y axis direction and gate electrodes extending in the X axis direction in the first layout of the first memory cell C31' in FIG. 1. Similarly, the second word line assist cell C34, the third word line assist cell C43', and the fourth word line assist cell C44' may respectively include active regions and gate electrodes identical to those in the layouts of the second memory cell C32', the third memory cell C41, and the fourth memory cell C42' in FIG. 7.

Figure 9:
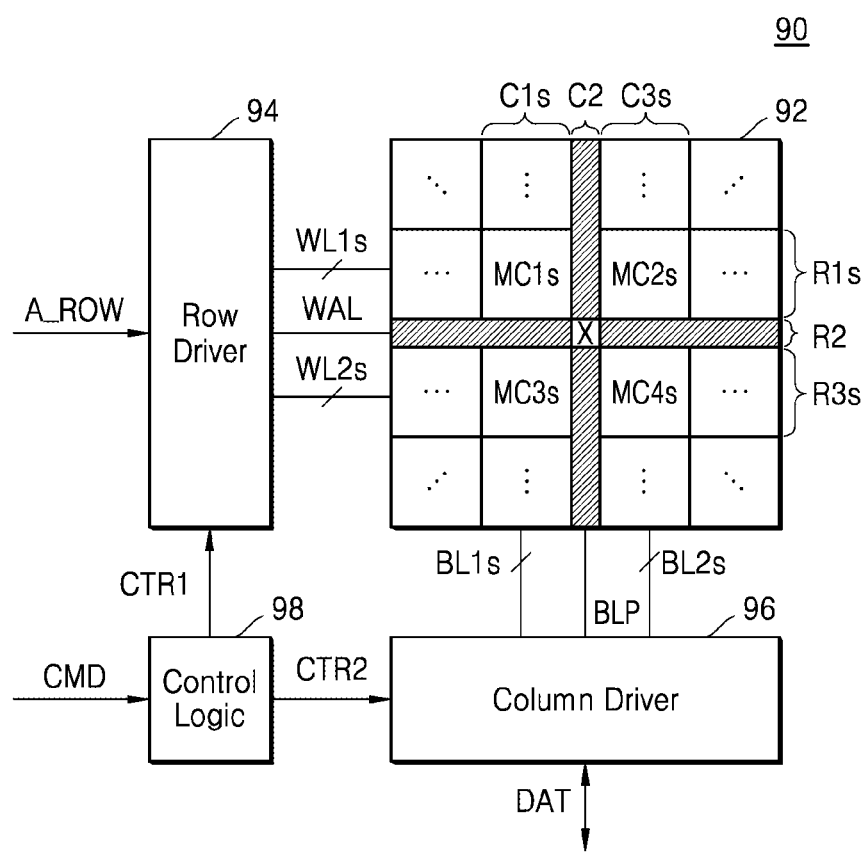
FIG. 9 is a block diagram of an integrated circuit according to an example embodiment of the inventive concept.

FIG. 9 is a block diagram of an integrated circuit according to an example embodiment of the inventive concept. In detail, FIG. 9 is a block diagram that illustrates a memory device 90 included in the integrated circuit. Compared to the memory device 10 of FIG. 1, a cell array 92 of FIG. 9 may include a plurality of write assist cells arranged in a second row R2. As shown in FIG. 9, the memory device 90 may include a cell array 92, a row driver 94, a column driver 96, and a control logic 98. Hereinafter, among descriptions of FIG. 9, descriptions that are the same as those of FIG. 1 will be omitted.

The cell array 92 may include, in a series of first rows R1s, the plurality of first memory cells MC1s and the plurality of second memory cells MC2s respectively arranged in the series of first columns C1s and the series of third columns C3s, and may include, in a series of third rows R3s, a plurality of third memory cells MC3s and a plurality of fourth memory cells MC4s respectively arranged in the series of first columns C1s and the series of third columns C3s. In addition, the cell array 92 may include a plurality of word line assist cells arranged in the second column C2 and a plurality of write assist cells arranged in the second row R2. To compensate for the effects due to the parasitic element of the bit line, a write assist cell (or a write assistance cell) may amplify the voltage of the bit line in the write operation in advance. As shown in FIG. 9, the cell array 92 may include at least one dummy cell in a region X in which the second column C2 crosses with the second row R2. In some embodiments, the plurality of write assist cells may be arranged in two or more consecutive rows, and a plurality of write assist lines may respectively extend on consecutive rows.

The row driver 94 may be connected to the cell array 92 through a plurality of first word lines WL1s, a write assist line WAL, and a plurality of second word lines WL2s. The plurality of first memory cells MC1s and the plurality of second memory cells MC2s may be connected to the plurality of first word lines WL extending on the series of first rows R1s, the plurality of write assist cells may be connected to the write assist line WAL extending on the second row R2, and the plurality of third memory cells MC3s and the fourth memory cells MC4s may be connected to the plurality of second word lines WL2s extending on the series of third rows R3s.

The column driver 96 may be connected to the cell array through the plurality of first bit lines BL1s, the pseudo bit line BLP, and the plurality of second bit lines BL2s. The plurality of first memory cells MC1s and the plurality of third memory cells MC3 may be connected to the plurality of first bit lines BL1s extending on a series of first columns C1s, the plurality of word line assist cells may be connected to the pseudo bit line BLP extending on the second column C2, and the plurality of second memory cells MC2s and the plurality of fourth memory cells MC4 may be connected to the plurality of second word lines BL2s extending on a series of third columns C3s.

Figure 10:
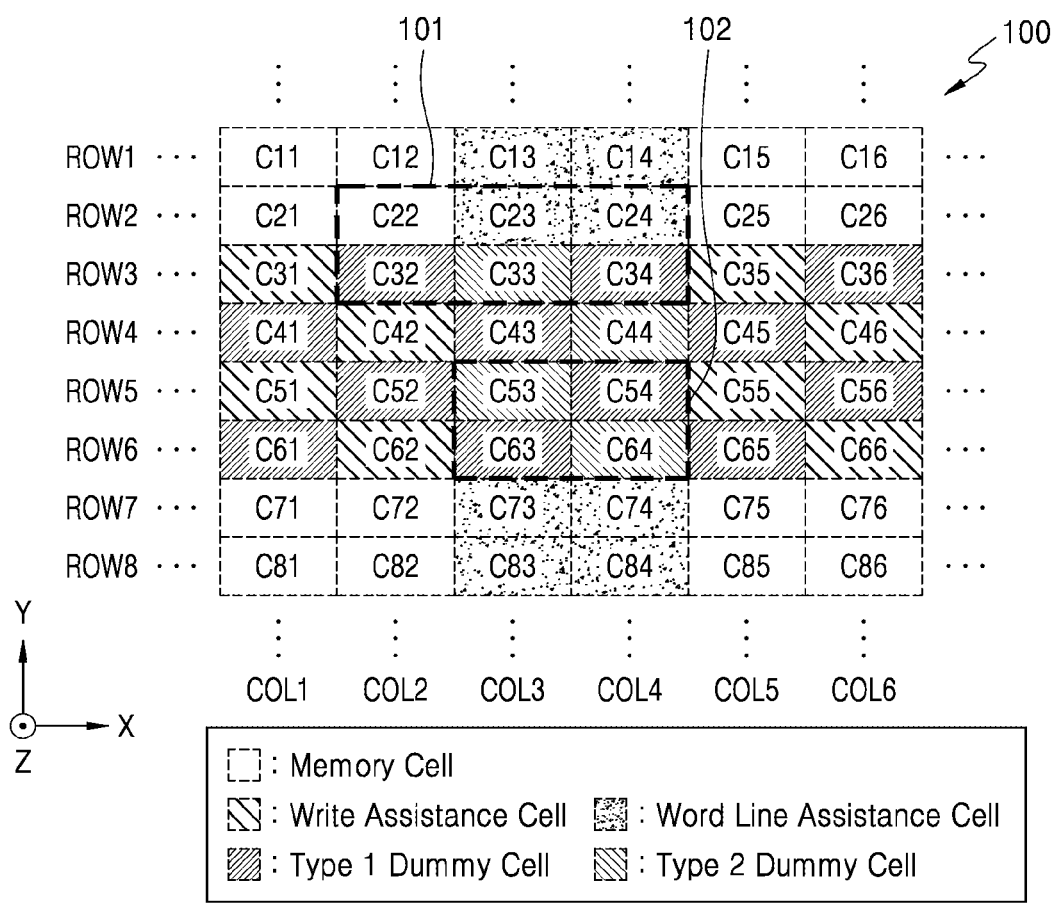
FIG. 10 is a top-plan view of a layout of a cell array according to an example embodiment of the inventive concept.

FIG. 10 is a top-plan view of a layout of a cell array 100 according to an example embodiment of the inventive concept. As shown in FIG. 10, the cell array 100 may include a plurality of cells C11 through C86 having a same footprint.

The plurality of cells C11 through C86 may include the memory cells, the write assist cells, the word line assist cells, first type dummy cells, and second type dummy cells. For example, as shown in FIG. 10, the cell array 100 may include cells C11, C15, C71, C75, and the like as the memory cells in regions in which the first row ROW1, the second row ROW2, a seventh row ROW7, and an eighth row ROW8 respectively cross with the first column COL1, the second column COL2, the fifth column COL5, and the sixth column COL6. The cell array 100 may include cells C13, C73, and the like as the word line assist cells in regions in which the first row ROW1, the second row ROW2, seventh row ROW7, and the eighth row ROW8 cross with the third column COL3 and the fourth column COL4. The cell array 100 may include cells C31, C35, and the like, which are the write assist cells, and cells C32 and C36, which are the first type dummy cells, in regions in which the third row ROW3 through the sixth row ROW6 cross with the first column COL1, the second column COL2, the fifth column COL5, and the sixth column COL6. The cell array 100 may include cells C33 and the like, which are the second type dummy cells, and cells C34 and the like, which are the first type dummy cells, in regions in which the third row ROW3 through the sixth row ROW6 cross with the third column COL3 and the fourth column COL4. An example of a circuit corresponding to a region 101 including six cells C22, C23, C24, C32, C33, and C34 will be described below with reference to FIG. 11, and an example of a layout corresponding to a region 102 including four cells C53, C54, C63, and C64 will be described below with reference to FIG. 12.

Figure 11:
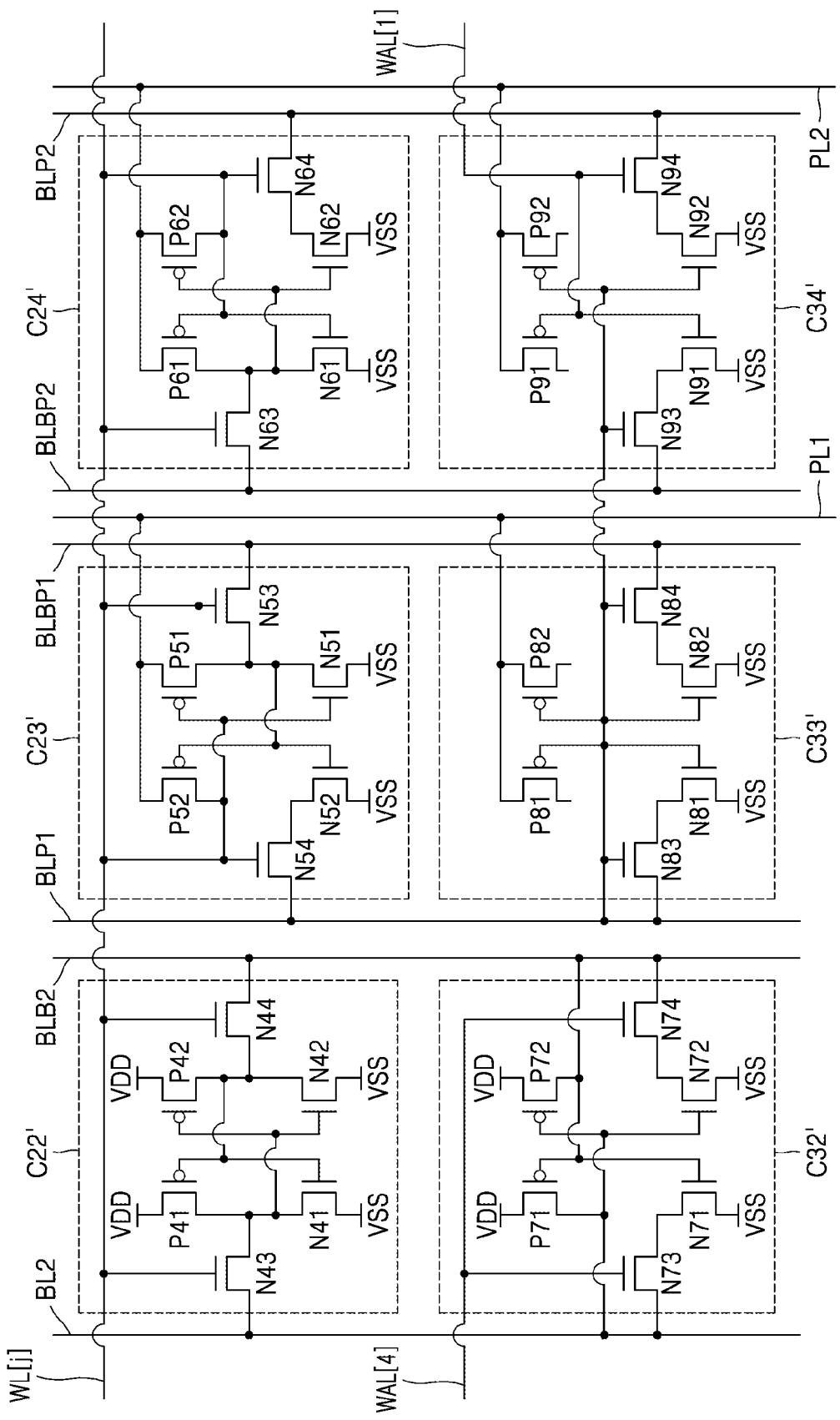
FIG. 11 is a circuit diagram of an example of a memory cell, a word line assist cell, a write assist cell, and a dummy cell according to an example embodiment of the inventive concept.

FIG. 11 is a circuit diagram of an example of a memory cell, a word line assist cell, a write assist cell, and a dummy cell according to an example embodiment of the inventive concept. In detail, the circuit diagram shown in FIG. 11 illustrates an equivalent circuit 110 corresponding to six cells C22, C23, C24, C32, C33, and C34 included in the region 101 of FIG. 10. As described above with reference to FIG. 10, a memory cell C22', a first word line assist cell C23', and a second word line assist cell C24' may be arranged in a same row, that is, the second row ROW2 of FIG. 10, and a write assist cell C32', a first dummy cell C33', and a second dummy cell C34' of FIG. 11 may be arranged in a same row, that is, the third row ROW3 of FIG. 10. Hereinafter, FIG. 11 will be described with reference to FIG. 10, and descriptions that are the same as those described with reference to the drawings will be omitted.

Referring to FIG. 11, the memory cell C22' may be connected to the word line WL[j], the second bit line BL2, and the second complimentary bit line BLB2, and may include a first PFET P41, a second PFET P42, and a first NFET N41 through a fourth NFET N44. A first word line assist cell C23' may be connected to the word line WL[j], the first pseudo bit line BLP1, the second pseudo bit line BLBP1, and the first power line PL1, and may include a first PFET P51, a second PFET P52, and a first NFET N51 through a fourth NFET N54. A second word line assist cell C24' may be connected to the word line WL[j], the third pseudo bit line BLBP2, the fourth pseudo bit line BLP2, and the second power line PL2, and may include a first PFET P61, a second PFET P62 and a first NFET N61 through a fourth NFET N64. The write assist cell C32' may be connected to a fourth write assist line WAL [4], the second bit line BL2, and the second complimentary bit line BLB2, and may include a first PFET P71, a second PFET P72, and a first NFET N71 through a fourth NFET N74. The first dummy cell C33' may be connected to the first pseudo bit line BLP1, the second pseudo bit line BLBP1, the first power line PL1, and the second dummy cell C34', and may include a first PFET P81, a second PFET P82 and a first NFET N81 through a fourth NFET N84. The second dummy cell C34' may be connected to the third pseudo bit line BLBP2, the fourth pseudo bit line BLP2, a first write assist line WAL[1], and the second power line PL2, may be connected to the first pseudo bit line BLP1 through the first dummy cell C33', and may include a first PFET P91, a second PFET P92, and a first NFET N91 through a fourth NFET N94.

In the write operation, the row driver (for example, the row driver 94 in FIG. 9) may activate the fourth word line WAL[4] before activating one of the plurality of word lines, e.g., the word line WL[j]. Accordingly, the write assist cell C32' may amplify voltages of the second bit line BL2 and the second complimentary bit line BLB2 in advance, and accordingly, the data may be safely written to the memory cells C22' at an early stage.

The first dummy cell C33' may correspond to the second type dummy cell shown in FIG. 10. Due to the first pseudo bit line BLP1 to which the negative supply voltage VSS is applied, the first dummy cell C33' may not affect the second pseudo bit line BLBP1. In addition, the second dummy cell C34' may correspond to the first type dummy cell shown in FIG. 10. In the write operation, even when the first write assist line WAL[1] is activated by the row driver (for example, the row driver 94 in FIG. 9), due to the first pseudo bit line BLP1 and the fourth pseudo bit line BLP2 to which the negative supply voltage VSS is applied, the second dummy cell C34' may not affect the third pseudo bit line BLBP2.

Figure 12:
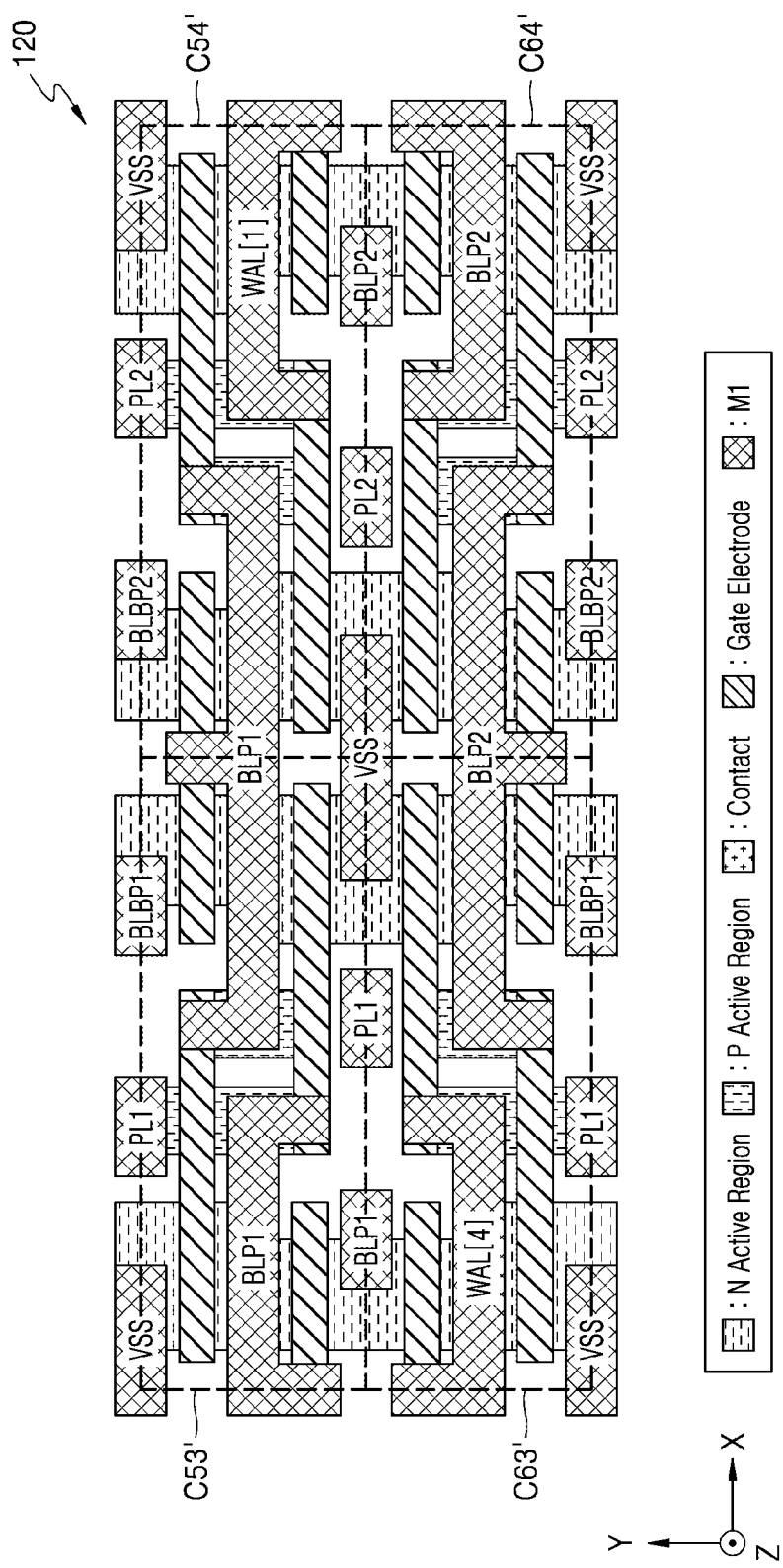
FIG. 12 is a top-plan view of a layout of a cell array according to an example embodiment of the inventive concept.

FIG. 12 is a top-plan view of a layout of a cell array 120 according to an example embodiment of the inventive concept. In detail, the top-plan view shown in FIG. 12 illustrates a layout corresponding to four cells C53, C54, C63, and C64 included in the region 102 in FIG. 10. In FIG. 12, a name on a pattern indicates a line, to which the pattern is electrically connected, and/or a voltage that is applied to the pattern.

As shown in FIG. 12, a first dummy cell C53' and a third dummy cell C63' may be arranged in a same column (that is, the third column COL3 in FIG. 10), and may be connected in common to the first pseudo bit line BLP1, the second pseudo bit line BLBP1, and the first power line PL1. A second dummy cell C54' and a fourth dummy cell C64' may be arranged in a same column (that is, the fourth column COL4 in FIG. 10), and may be connected in common to the third pseudo bit line BLBP2, the fourth pseudo bit line BLP2, and the second power line PL2. The second dummy cell C54' and the third dummy cell C63', which are the first type dummy cells, may be respectively connected to the first write assist line WAL[1] and the fourth write assist line WAL[4].

The dummy cell may include active regions and gate electrodes that are the same as or similar to those of a layout of a memory cell. For example, the first dummy cell C53' may include active regions and gate electrodes that are the same as active regions extending in the Y axis direction and gate electrodes extending in the X direction in the first layout of the first memory cell C31' in FIG. 7. Similarly, the second dummy cell C54', the third dummy cell C63', and the fourth dummy cell C64' may respectively include active regions and gate electrodes that are the same as those of layouts of the second memory cell C32', the third memory cell C41', and the fourth memory cell C42' in FIG. 7. In some embodiments, the first dummy cell C53' may have a layout that is generated by rotating the layout of the fourth dummy cell C64' by 180 degrees about a horizontal plane, and the second dummy cell C54' may have a layout that is generated by rotating the layout of the third dummy cell C63' about a horizontal plane.

Figure 13A:
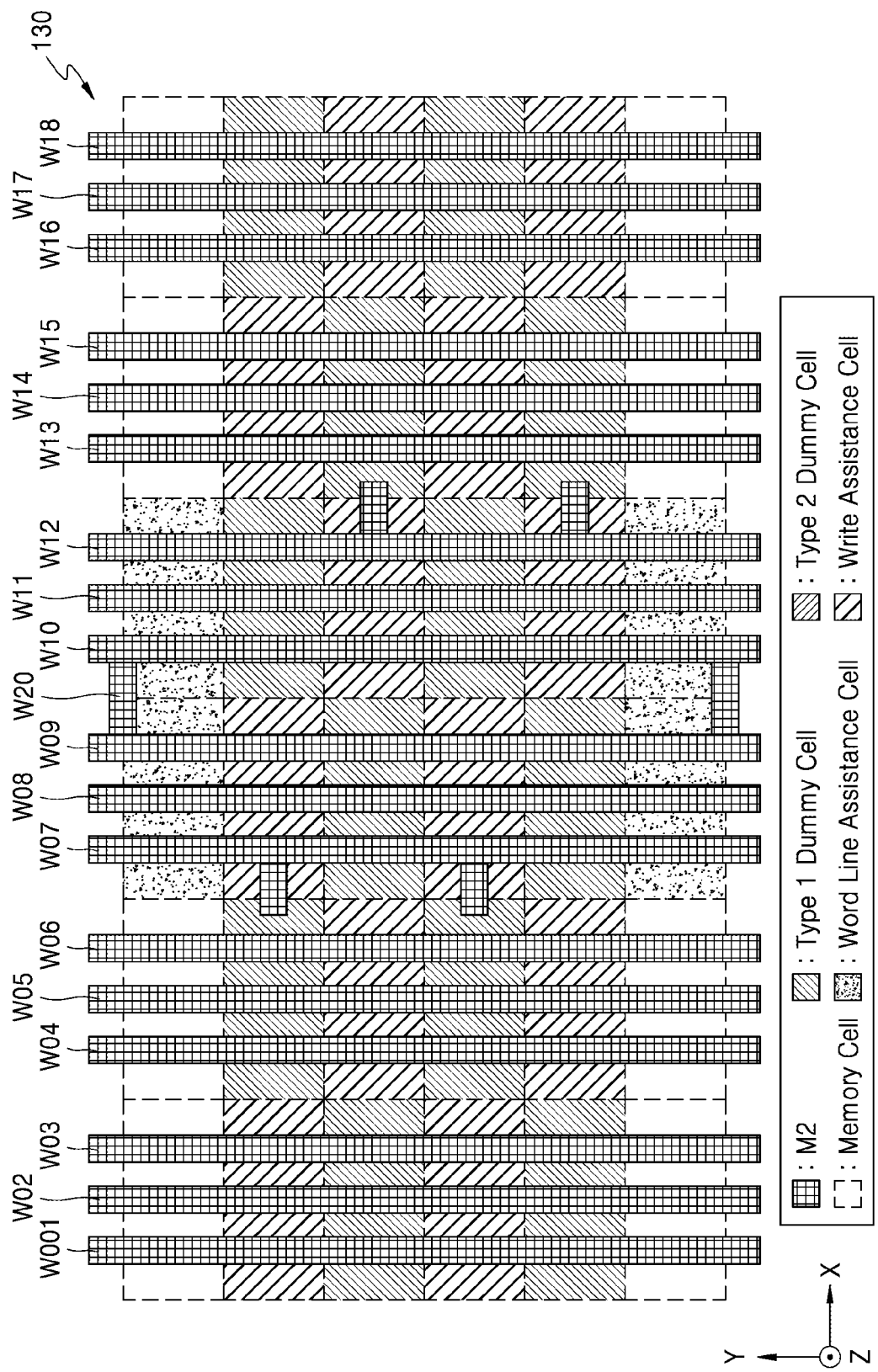
FIGS. 13A and 13B are top-plan views of layouts of an integrated circuit according to example embodiments of the inventive concept.
Figure 13B:
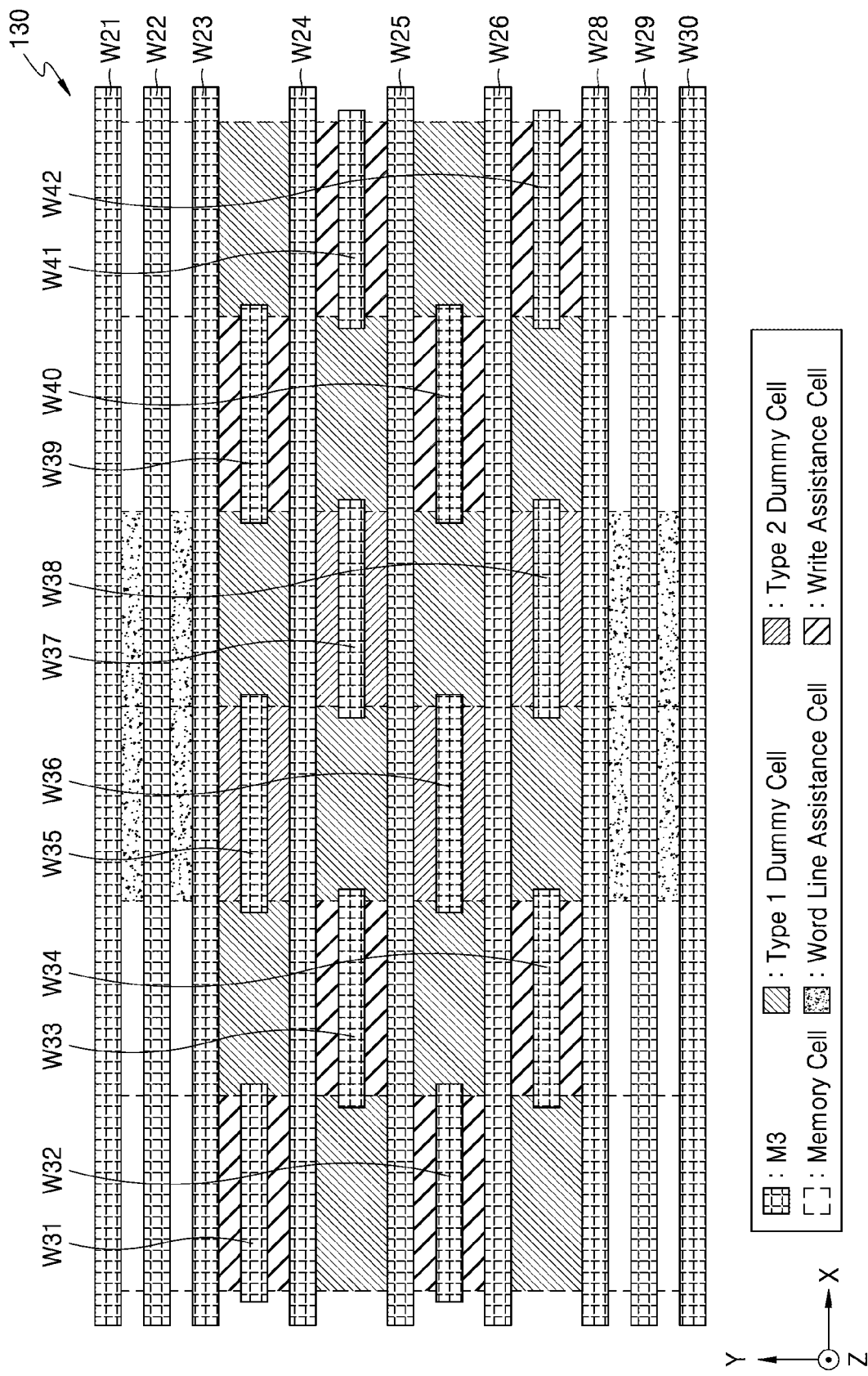

FIGS. 13A and 13B are top-plan views of layouts of an integrated circuit 130 according to example embodiments of the inventive concept. Particularly, the top-plan views in FIGS. 13A and 13B respectively show patterns formed on the cell array. For convenience of illustration, FIG. 13A and FIG. 13B may only illustrate some of the wiring layers, and the integrated circuit 130 may further include other patterns in addition to the patterns shown in FIGS. 13A and 13B. Word lines, write assist lines, bit lines, and pseudo bit lines may extend on the cells included in the cell array, and lines configured to provide the positive supply voltage VDD and the negative supply voltage VSS may extend to the cells.

Referring to FIG. 13A, on a second wiring layer M2 above a first wiring layer (for example, a first wiring layer M1 in FIG. 7), a plurality of patterns W01 through W18 may extend in a direction parallel to the Y axis. Memory cells, write assist cells, and dummy cells arranged in a same column may be connected in common to patterns in the second wiring layer M2 extending on the column. In some embodiments, patterns W01, W04, W13, and W13 may respectively correspond to the bit lines, patterns W03, W06, W15, and W18 may respectively correspond to the complimentary bit lines, and the positive supply voltage VDD may be applied to patterns W02, W05, W14, and W17. In some embodiments, each of the patterns W02, W05, W14, and W17, to which the positive supply voltage VDD is applied, may have portions protruding in a direction parallel to the X axis for vias for connection to patterns in the first wiring layer M1, that is, vias in a first via layer.

Word line assist cells and dummy cells arranged in a same column may be connected in common to patterns of the second wiring layer M2 extending on the column. In some embodiments, patterns W07, W09, W10, and W12 may respectively correspond to the first pseudo bit line BLP1, the second pseudo bit line BLBP1, the third pseudo bit line BLBP2, and the fourth pseudo bit line BLP2, and patterns W08 and W11 may respectively correspond to the first power line PL1 and the second power line P2. As shown in FIG. 13A, in the second type dummy cells, the pattern W07 may have portions protruding in a direction parallel to the X axis for vias for connection to patterns of the first wiring layer M1, which is connected to the first pseudo bit line BLP1, and the patterns in a third wiring layer (for example, a third wiring layer M3 in FIG. 13B) above the second wiring layer M2. In addition, in the second type dummy cells, the pattern W12 may have portions protruding in the X axis direction for vias for connection to the patterns of the first wiring layer M1, which is connected to the fourth pseudo bit line BLP2, and the patterns of the third pattern layer. In addition, the integrated circuit 130 may include a pattern (for example, a pattern W20) of the second wiring layer M2 extending in the X axis direction to connect the second pseudo bit line BLBP1 and the third pseudo bit line BLBP2.

Referring to FIG. 13B, in the third wiring layer M3 above the second wiring layer M2, a plurality of patterns W21 through W30 may extend in a direction parallel to the X axis. In some embodiments, the negative supply voltage VSS may be applied to patterns W21, W23, W24, W25, W26, W28, and W30 extending along boundaries of the rows. Memory cells and word line assist cells arranged in a same row may be connected in common to the pattern of the third wiring layer M3 extending on the row. For example, patterns W22 and W29 may respectively correspond to word lines.

The pattern of the third wiring layer M3 may extend in a direction parallel to the X axis on the write assist cell and the second type dummy cell. For example, patterns W31 and W33 may be connected to a third write assist line WAL3, patterns W33 and W34 may be connected to the fourth write assist line WAL[4], patterns W39 and W40 may be connected to the first write assist line WAL[1], and patterns W41 and W42 may be connected to a second write assist line WAL2. In addition, patterns W35 and W36 may be connected to the first pseudo bit line BLP1, and patterns W37 and W38 may be connected to the fourth pseudo bit line BLP2.

Figure 14:
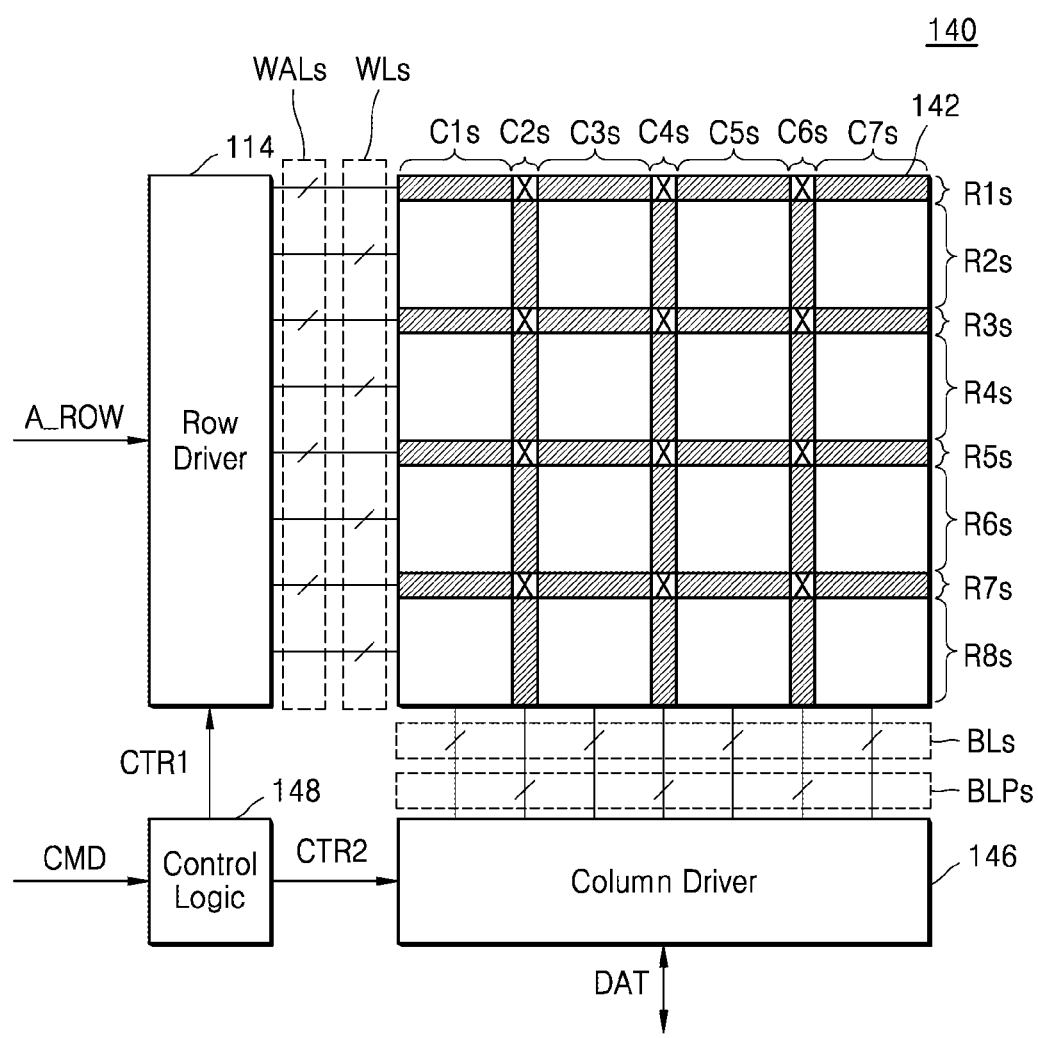
FIG. 14 is a block diagram of an integrated circuit according to an example embodiment of the inventive concept.

FIG. 14 is a block diagram of an integrated circuit according to an example embodiment of the inventive concept. In detail, the block diagram shown in FIG. 14 illustrates a memory device 10 included in the integrated circuit. As shown in FIG. 14, the memory device 140 may include a cell array 142, a row driver 144, a column driver 146, and a control logic 148. Hereinafter, among descriptions of FIG. 14, descriptions that are the same as those of FIGS. 1 and 9 are omitted.

The cell array 142 may include memory cells in regions in which the series of first columns C1$s$, the series of third columns C3$s$, a series of fifth columns C5$s$, and a series of seventh columns C1$s$ cross with a series of second rows R2$s$, a series of fourth rows R4$s$, a series of sixth rows R6$s$, and a series of eighth rows R8$s$. In addition, the cell array 142 may include word line assist cells arranged in the series of second columns C2$s$, the series of fourth columns C4$s$, and the series of sixth columns C6$s$, and may include write assist cells and dummy cells arranged in the series of first rows R1$s$, the series of third rows R3$s$, the series of fifth rows R5$s$, and the series of seventh rows R7$s$. The cell array 142 may also include dummy cells arranged in regions X in which the series of second columns C2$s$, the series of fourth columns C4$s$, the series of sixth columns C6$s$ cross with the series of first rows R1$s$, the series of third rows R3$s$, the series of fifth rows R5$s$, and the series of seventh rows R7$s$. As shown in FIG. 14, when the word line assist cells and the write assist cells are regularly arranged, even when a size of the cell array 142 increases, effects due to the parasitic elements of the word lines and bit lines may be compensated properly.

The row driver 144 may be connected to the memory cells and the word line assist cells through the plurality of word lines WLs, and may be connected to the write assist cells through a plurality of write assist lines WALs. The row driver 144 may activate one word line among the plurality of word lines WLs in the read operation or the write operation, and may activate at least one write assist cell by activating some of the plurality of write assist lines WALs in the write operation.

The column driver 146 may be connected to the memory cells, the write assist cells, and the dummy cells through a plurality of bit lines BLs, and may be connected to the word line assist cells and the dummy cells through a plurality of pseudo bit lines BLPs. The column driver 146 may control the word line assist cells through the plurality of pseudo bit lines BLPs in the write operation or the read operation. In some embodiments, the column driver 146 may be connected to the word line assist cells and the dummy cells through a plurality of power lines, and may control the word line assist cells through the plurality of power lines as well as the plurality of pseudo bit lines BLPs.

Figure 15:
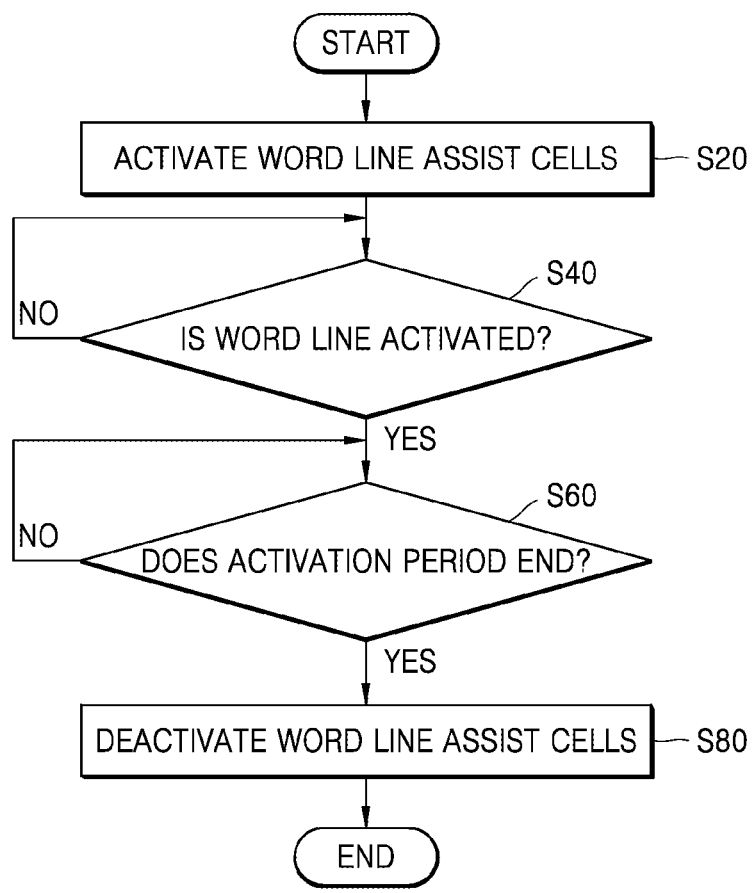
FIG. 15 is a flowchart that illustrates a method of operating an integrated circuit according to an example embodiment of the inventive concept.

FIG. 15 is a flowchart illustrating a method of operating an integrated circuit according to an example embodiment. Particularly, the flowchart in FIG. 15 illustrates an example of an operation performed by a memory device included in the integrated circuit. As shown in FIG. 15, the operation method of the integrated circuit may include a plurality of operations (S20, S40, S60, and S80). In some embodiments, the operation method in FIG. 15 may be performed by the column driver 16 in FIG. 1, and hereinafter, FIG. 15 will be described with reference to FIG. 1.

Referring to FIG. 15, in operation S20, the word line assist cells may activated. For example, the column driver 16 may activate the word line assist cells through the pseudo bit line BLP. In some embodiments, the column driver 16 may activate the word line assist cells through the power line as well as the pseudo bit line BLP. An example of operation S20 will be described below with reference to FIG. 16.

In operation S40, it may be determined whether the word line is activated. For example, the second control signal CTR2 in FIG. 1 may include a write enable signal and a read enable signal, and the column driver 16 may identify activation of the word line based on the write enable signal or the read enable signal that is activated. As shown in FIG. 15, when the word line is activated, operation S60 may be performed subsequently. Consequently, the word line assist cells may be activated by the column driver 16 before the word lines are activated.

In operation S60, it may be determined whether the activation period ends. For example, the column driver 16 may identify an end of the activation period based on a write enable signal or a read enable signal that is deactivated. In some embodiments, the column driver 16 may identify an end of the activation period to deactivate the word line assist cells before the word lines are deactivated or at the same time with deactivation of the word lines. As shown in FIG. 15, when the activation period ends, operation S80 may be performed subsequently.

In operation S80, the word line assist cells may be deactivated. For example, the column driver 16 may deactivate the word line assist cells through the pseudo bit line BLP. In some embodiments, the column driver 16 may deactivate the word line assist cells through the power lines, as well as the pseudo bit line BLP. An example of operation S80 will be described below with reference to FIG. 16.

Figure 16:
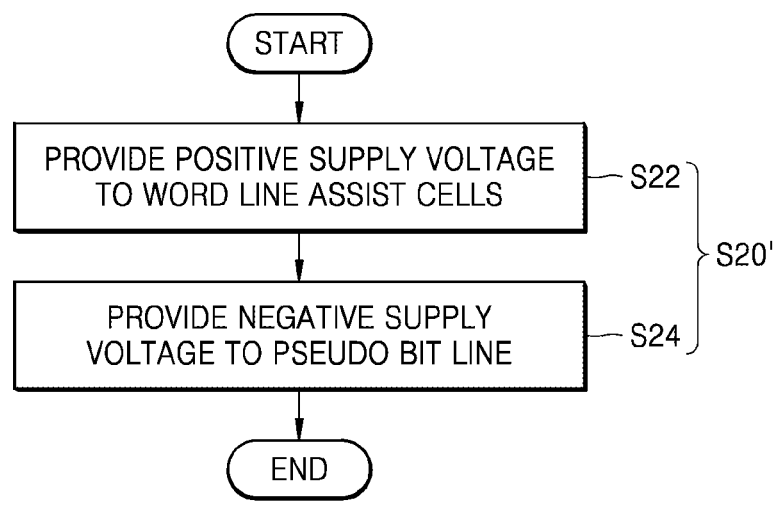
FIG. 16 is a flowchart that illustrates a method of operating an integrated circuit according to an example embodiment of the inventive concept.

FIG. 16 is a flowchart of a method of operating an integrated circuit according to an example embodiment of the inventive concept. In detail, the flowchart of FIG. 16 illustrates an example of operation S20 of FIG. 15. As described above with reference to FIG. 15, in operation S20' of FIG. 16, the word line assist cells may be activated. As shown in FIG. 16, operation S20' may include operation S22 and operation S24. In some embodiments, operation S22 and operation S44 may be performed in parallel, or operation S24 may be performed before operation S22. Hereinafter, FIG. 16 will be described with reference to FIG. 1.

Referring to FIG. 16, in operation S22, the positive supply voltage VDD may be provided to the word line assist cells. For example, the column driver 16 may be connected to the word line assist cells through a power line extending on the cell array 12, and may provide the positive supply voltage VDD to the word line assist cells by applying the positive supply voltage VDD to the power line.

In operation S24, the negative supply voltage VSS may be provided to the pseudo bit line BLP. For example, the column driver 16 may be connected to the word line assist cells through the pseudo bit line BLP extending on the cell array 12, and may provide the negative supply voltage VSS to the pseudo bit line BLP. Accordingly, the word line assist cells may be activated, and effects due to the parasitic elements of the word lines may be compensated for by sensing and accelerating activation of the word lines.

Figure 17:
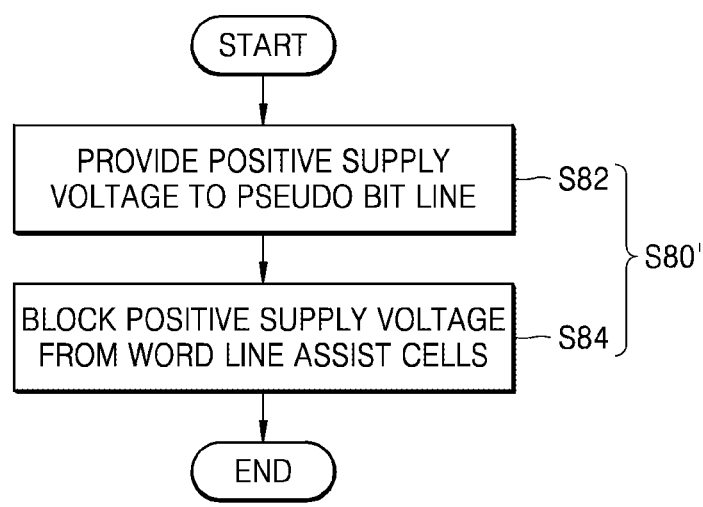
FIG. 17 is a flowchart that illustrates a method of operating an integrated circuit according to an example embodiment of the inventive concept.

FIG. 17 is a flowchart of a method of operating an integrated circuit according to an example embodiment of the inventive concept. In detail, the flowchart show in FIG. 17 illustrates an example of operation S80 of FIG. 15. As described above with reference to FIG. 15, in operation S80' of FIG. 17, the word line assist cells may be deactivated. As shown in FIG. 17, operation S80' may include operation S82 and operation S84. In some embodiments, operation S82 and operation S84 may be performed in parallel, or operation S84 may be performed before operation S82. Hereinafter, FIG. 17 will be described with reference to FIG. 1.

In operation S82, the positive supply voltage VDD may be provided to the pseudo bit line BLP. For example, the column driver 16 may be connected to the word line assist cells through the pseudo bit line BLP extending on the cell array 12, and may provide the positive supply voltage VDD to the pseudo bit line BLP.

In operation S84, the positive supply voltage VDD may be blocked or removed from the word line assist cells. For example, the column driver 16 may be connected to the word line assist cells through a power line extending on the cell array 12, and may block or remove the positive supply voltage VDD from the word line assist cells by floating the power line. Accordingly, the word line assist cells may be deactivated and may not affect voltage changes (for example, voltage drop) of the word line.

Figure 18:
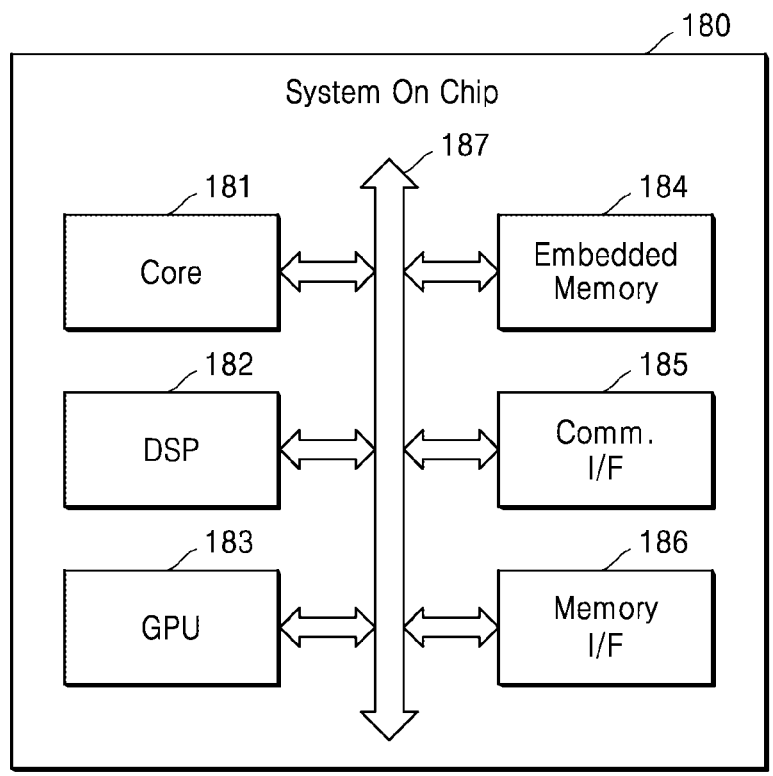
FIG. 18 is a block diagram of a system-on-chip according to an example embodiment of the inventive concept.

FIG. 18 is a block diagram of a system-on-chip 180 according to an example embodiment of the inventive concept. The system-on-chip (SoC) 180 may refer to an integrated circuit in which components of a computing system or other electrical systems are integrated. As an example of the SoC 180, an application processor (AP) may include a processor and components for other functions. As shown in FIG. 18, the SoC 180 may include a core 181, a digital signal processor (DSP) 182, a graphic processing unit (GPU) 183, an embedded memory 184, a communication interface 185, and a memory interface 186. Components in the SoC 180 may communicate with one another through a bus 187.

The core 181 may process instructions and may control operations of the components included in the SoC 180. For example, the core 181 may drive an operation system and execute applications on the operation system by processing a series of instructions. The DSP 182 may generate useful data by processing a digital signal, for example, a digital signal provided by the communication interface 185. The GPU 183 may generate data for an image output through the display device through image data provided by the embedded memory 184 or the memory interface 186, and may also encode the image data. In some embodiments, the memory device described above with reference to the drawings may be included in the core 181, the DSP 182, and/or the GPU 183 as a cache memory and/or a buffer. Accordingly, based on high or improved reliability and efficiency of the memory device, the core 181, the DSP 182, and/or the GPU 183 may also have high or improved reliability and efficiency.

The embedded memory 184 may store data used for operations of the core 181, the DSP 182, and/or the GPU 183. In some embodiments, the embedded memory 184 may include the memory device described above with reference to the drawings. Accordingly, the embedded memory 184 may provide a reliable write operation capability, may have a reduced area and reduced power consumption, and consequently, operation reliability and efficiency of the SoC 180 may be improved.

The communication interface 185 may provide an interface for a communication network or one-to-one communication. The memory interface 186 may provide an interface for an external memory of the SoC 180, for example, dynamic random access memory (DRAM), flash memory, and the like.

While the inventive concept has been particularly shown and described with reference to embodiments thereof, it will be understood that various changes in form and details may be made therein without departing from the spirit and scope of the following claims.

What is claimed is:

1. An integrated circuit comprising:
a cell array comprising a plurality of memory cells in a plurality of first columns and a plurality of word line assist cells in at least one second column;
a plurality of word lines respectively extending on a plurality of first rows of the cell array and connected to the plurality of memory cells and the plurality of word line assist cells;
at least one pseudo bit line respectively extending on the at least one second column and comprising a first pseudo bit line; and
a row driver configured to drive the plurality of word lines,
wherein each of the plurality of word line assist cells is configured to accelerate activation of respective ones of the plurality of word lines based on a voltage of the at least one pseudo bit line, comprises transistors that are identical to those of each of the plurality of memory cells, and has a footprint identical to that of each of the plurality of memory cells.

2. The integrated circuit of claim 1,
wherein each of the plurality of word line assist cells comprises:
a first p-channel field effect transistor (PFET) connected between a first power node and a first node and comprising a control terminal connected to one of the plurality of word lines;
a first n-channel field effect transistor (NFET) connected between the first node and the first pseudo bit line and comprising a control terminal connected to the one of the plurality of word lines; and
a second PFET connected between the first power node and the one of the plurality of word lines and comprising a control terminal connected to the first node.

3. The integrated circuit of claim 2, further comprising a column driver configured to apply a negative supply voltage to the first pseudo bit line before the one of the plurality of word lines is activated and to apply a positive supply voltage to the first pseudo bit line before the one of the plurality of word lines is deactivated from being activated.

4. The integrated circuit of claim 2, further comprising at least one power line respectively extending on the at least one second column and including a first power line; and
a column driver connected to the first power node through the first power line and configured to apply a positive supply voltage to the first power line before the one of the plurality of word lines is activated and to float the first power line before the one of the plurality of word lines is deactivated from being activated.

5. The integrated circuit of claim 2, wherein the at least one pseudo bit line further comprises a second pseudo bit line; and
wherein each of the plurality of word line assist cells further comprises:
a second NFET connected between a second node and a second power node, to which a negative supply voltage is applied, and a control terminal connected to the first node;
a third NFET connected between the first node and the first pseudo bit line and comprising a control terminal connected to the one of the plurality of word lines; and
a fourth NFET connected between the second pseudo bit line and the second node and comprising a control terminal connected to the one of the plurality of word lines.

6. The integrated circuit of claim 1, wherein the cell array further comprises:
a plurality of write assist cells in at least one second row; and
at least one dummy cell in a region in which the at least one second column crosses with the at least one second row, and
each of the plurality of write assist cells and the at least one dummy cell comprises transistors identical to those of each of the plurality of memory cells and has a footprint identical to that of each of the plurality of memory cells.

7. The integrated circuit of claim 6, wherein the cell array further comprises, in the at least one second row, a plurality of first dummy cells respectively arranged adjacent to each of the plurality of write assist cells in a row direction or a column direction, and
wherein the at least one dummy cell comprises:
a second dummy cell corresponding to a first circuit of each of the plurality of first dummy cells; and
a third dummy cell corresponding to a second circuit that is different from the first circuit.

8. The integrated circuit of claim 7, further comprising a plurality of pseudo bit lines respectively extending on the at least one second column, and
wherein the third dummy cell comprises:
a third PFET and a fourth PFET respectively comprising control terminals, which are connected to a first one of the plurality of pseudo bit lines, and floated current terminals;
a fifth NFET and a sixth NFET respectively comprising control terminals connected to the first one of the plurality of pseudo bit lines;
a seventh NFET connected between the first pseudo bit line and the fifth NFET and comprising a control terminal connected to the first one of the plurality of pseudo bit lines; and
an eighth NFET connected between a second one of the plurality of pseudo bit lines and the sixth NFET and also connected to the first one of the plurality of pseudo bit lines.

9. An integrated circuit comprising:
a cell array comprising a plurality of cells, the plurality of cells respectively comprising same transistors and respectively having a same footprint;
a plurality of word lines respectively extending on a plurality of first rows of the cell array; and
a row driver connected to the plurality of word lines,
wherein the plurality of cells comprise a plurality of memory cells connected to the plurality of word lines and arranged in a series of first columns;
a plurality of first word line assist cells connected to the plurality of word lines and arranged in a second column; and
a plurality of second word line assist cells connected to the plurality of word lines and arranged in a third column that is adjacent to the second column,
wherein each of the plurality of first word line assist cells has a first layout that is symmetrical to a second layout of a second word line assist cell, which is arranged in a same row as the each of the plurality of first word line assist cells, with respect to an axis parallel to a column direction.

10. The integrated circuit of claim 9, wherein the plurality of memory cells have a plurality of layouts, respectively, that are symmetrical with respect to one another, and wherein each of the first layout and the second layout comprises active regions and gate electrodes that are the same as those of one of the plurality of layouts.

11. The integrated circuit of claim 10, wherein the active regions extend in the column direction, and
wherein the gate electrodes extend in a row direction.

12. The integrated circuit of claim 9, further comprising a plurality of bit lines respectively extending on the series of first columns and connected to the plurality of memory cells;
a first pseudo bit line and a second pseudo bit line extending on the second column and connected to the plurality of first word line assist cells;
a third pseudo bit line and a fourth pseudo bit line extending on the third column and connected to the plurality of second word line assist cells; and
a column driver connected to the plurality of bit lines, the second pseudo bit line, and the third pseudo bit line,
wherein the first pseudo bit line and the fourth pseudo bit line are configured to receive a negative supply voltage.

13. The integrated circuit of claim 12, further comprising, on the cell array, a plurality of patterns connecting the second pseudo bit line and the third pseudo bit line.

14. The integrated circuit of claim 13, wherein the plurality of patterns are formed in a wiring layer in which the first pseudo bit line, the second pseudo bit line, the third pseudo bit line, and the fourth pseudo bit line are formed.

15. The integrated circuit of claim 9, further comprising a first power line extending on the second column and connected to the plurality of first word line assist cells;
a second power line extending on the third column and connected to the plurality of second word line assist cells; and
a column driver configured to selectively provide a positive supply voltage to the plurality of first word line assist cells through the first power line and selectively provide a positive supply voltage to the plurality of second word line assist cells through the second power line.

16. The integrated circuit of claim 9, wherein the plurality of cells further comprise:
a plurality of write assist cells arranged in at least one second row of the cell array; and
a plurality of dummy cells arranged in a region in which the at least one second row crosses with the second column and the third column.

17. The integrated circuit of claim 16, wherein the plurality of dummy cells comprise a first dummy cell and a second dummy cell respectively corresponding to different circuits, and
wherein the first dummy cell and the second dummy cell are respectively arranged in a second column of the at least one second row and a third column of the at least one second row.

18. An integrated circuit comprising:
a cell array comprising a plurality of cells, the plurality of cells respectively comprising same transistors and respectively having a same footprint;
a plurality of word lines respectively extending on a plurality of first rows of the cell array; and
a row driver connected to the plurality of word lines,
wherein the plurality of cells comprise:
a plurality of first memory cells connected to the plurality of word lines and arranged in a series of first columns;
a plurality of first word line assist cells connected to the plurality of word lines and arranged in at least one second column that is adjacent to the series of first columns; and
a plurality of second memory cells connected to the plurality of word lines and arranged in a series of third columns that are adjacent to the at least one second column.

19. The integrated circuit of claim 18, further comprising a plurality of second word line assist cells connected to the plurality of word lines and arranged in at least one fourth column that is adjacent to the series of third columns, and
wherein a number of the series of first columns is a same as a number of the series of third columns.

20. The integrated circuit of claim 19, further comprising a plurality of bit lines respectively extending on the series of first columns and the series of third columns and connected to the plurality of first memory cells and the plurality of second memory cells;
at least one first pseudo bit line respectively extending on the at least one second column and connected to the plurality of first word line assist cells;
at least one second pseudo bit line respectively extending on the at least one fourth column and connected to the plurality of second word line assist cells; and
a column driver connected to the plurality of bit lines and configured to activate or deactivate the plurality of first word line assist cells and the plurality of second word line assist cells through the at least one first pseudo bit line and the at least one second pseudo bit line.

* * * * *